(12) United States Patent
Moon

(10) Patent No.: US 11,803,027 B2
(45) Date of Patent: Oct. 31, 2023

(54) CIRCUIT FOR CONTROLLING VOLTAGE FOR DRIVING LIQUID LENS AND CAMERA MODULE AND OPTICAL DEVICE COMPRISING SAME

(71) Applicant: LG INNOTEK CO., LTD., Seoul (KR)

(72) Inventor: Young Seop Moon, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 277 days.

(21) Appl. No.: 17/138,291

(22) Filed: Dec. 30, 2020

(65) Prior Publication Data

US 2021/0116675 A1   Apr. 22, 2021

Related U.S. Application Data

(63) Continuation of application No. 16/345,889, filed as application No. PCT/KR2017/012153 on Oct. 31, 2017, now Pat. No. 10,908,384.

(30) Foreign Application Priority Data

Oct. 31, 2016 (KR) .................. 10-2016-0143884
Feb. 27, 2017 (KR) .................. 10-2017-0025631

(51) Int. Cl.
*H03K 17/00*   (2006.01)
*G02B 7/09*    (2021.01)
(Continued)

(52) U.S. Cl.
CPC ............... *G02B 7/09* (2013.01); *G02B 3/14* (2013.01); *G02B 7/02* (2013.01); *G02B 26/08* (2013.01);
(Continued)

(58) Field of Classification Search
CPC ............................ H02M 3/07; H03K 17/005
See application file for complete search history.

(56) References Cited

U.S. PATENT DOCUMENTS 7,897,899 B2   3/2011   Uchino et al.
7,898,302 B1   3/2011   Casiraghi
(Continued)

FOREIGN PATENT DOCUMENTS

CN   103365028 A    10/2013
EP   1 835 313 A1   9/2007
(Continued)

*Primary Examiner* — Sibin Chen
(74) *Attorney, Agent, or Firm* — Birch, Stewart, Kolasch & Birch, LLP

(57) ABSTRACT

The present invention provides a circuit for controlling a voltage for driving liquid lens including a first voltage generator for outputting a first voltage; a second voltage generator for outputting a second voltage having an opposite polarity to the first voltage; a first switch for selecting one of the first voltage and a ground voltage, and transmitting the selected voltage; a second switch for selecting one of the second voltage and the ground voltage, and transmitting the selected voltage; and a third switch for selecting one of a voltage selected by the first switch and the voltage selected by the second switch, and transmitting the selected voltage, wherein the third switches is plural in number, and the first switch is connected in common to the plurality of third switches.

20 Claims, 18 Drawing Sheets

(51) Int. Cl.
*G02B 3/14* (2006.01)
*G05F 1/59* (2006.01)
*H02M 3/07* (2006.01)
*G02B 26/08* (2006.01)
*G02F 1/03* (2006.01)
*G02B 7/02* (2021.01)
*H04N 23/00* (2023.01)
*H04N 23/60* (2023.01)

(52) U.S. Cl.
CPC ............... *G02F 1/03* (2013.01); *G05F 1/59* (2013.01); *H02M 3/07* (2013.01); *H03K 17/005* (2013.01); *H04N 23/00* (2023.01); *H04N 23/60* (2023.01)

(56) References Cited

U.S. PATENT DOCUMENTS

| | | | |
|---|---|---|---|
| 8,749,539 B2 * | 6/2014 | Hung | G09G 3/3614 |
| | | | 345/209 |
| 2009/0153208 A1 * | 6/2009 | Lynch | G02F 1/13306 |
| | | | 359/666 |
| 2011/0211262 A1 | 9/2011 | Craen et al. | |
| 2012/0026297 A1 * | 2/2012 | Sato | H04N 25/41 |
| | | | 348/47 |
| 2012/0026596 A1 | 2/2012 | Berge et al. | |
| 2014/0247503 A1 | 9/2014 | Bianchi et al. | |
| 2018/0292725 A1 | 10/2018 | Moon et al. | |
| 2020/0319380 A1 * | 10/2020 | Kaminski | G02B 3/14 |
| 2021/0074534 A1 * | 3/2021 | Walker | H01J 49/025 |

FOREIGN PATENT DOCUMENTS

| | | |
|---|---|---|
| EP | 1 870 740 A1 | 12/2007 |
| JP | 2009-047801 A | 3/2009 |
| JP | 2010-276716 A | 12/2010 |
| JP | 2011-242542 A | 12/2011 |
| KR | 10-2009-0018965 A | 2/2009 |
| WO | WO 2007/107517 A1 | 9/2007 |
| WO | WO 2008/037787 A2 | 4/2008 |

* cited by examiner

[FIG. 1]
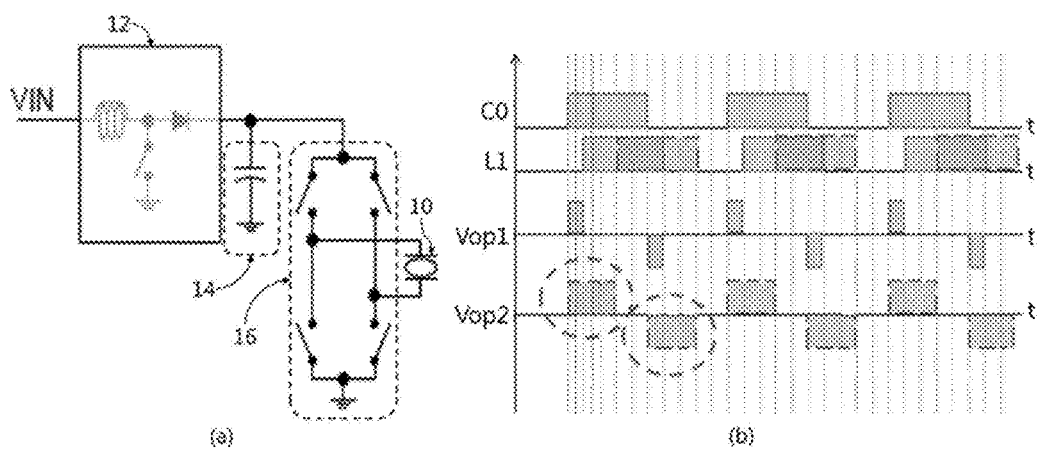
[FIG. 2]
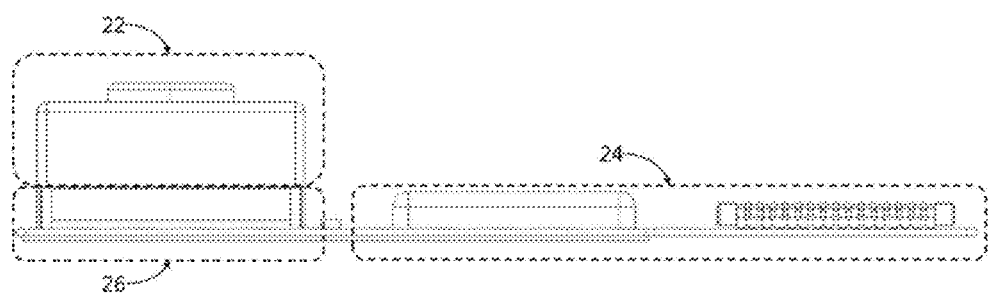

[FIG. 3]
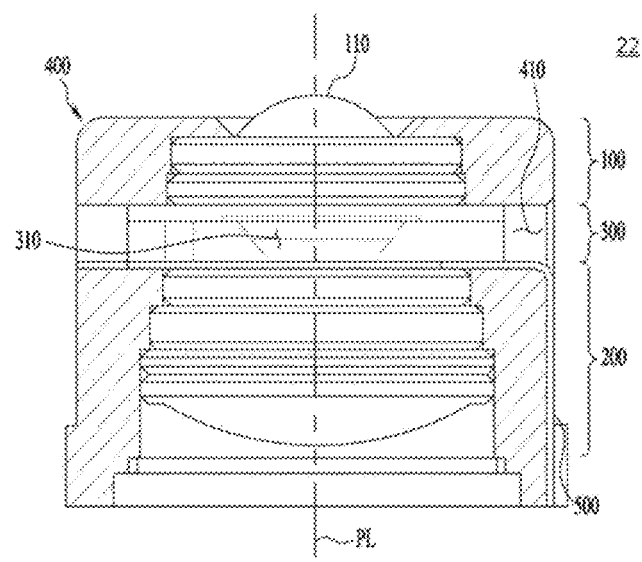
[FIG. 4]
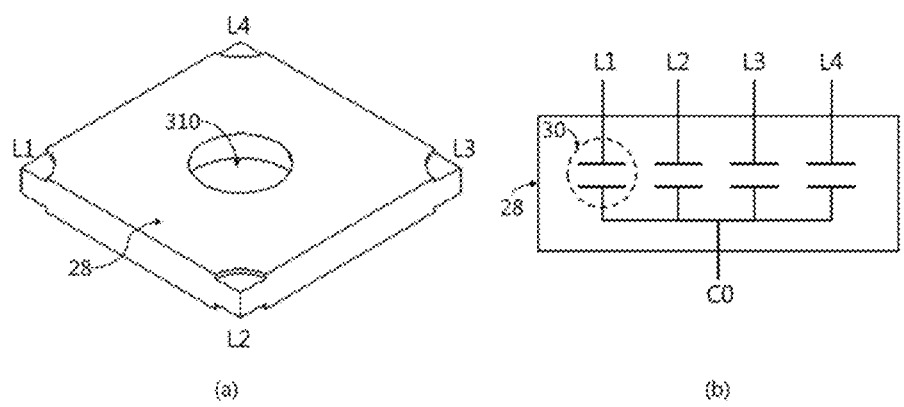
(a)  (b)

[FIG. 5]
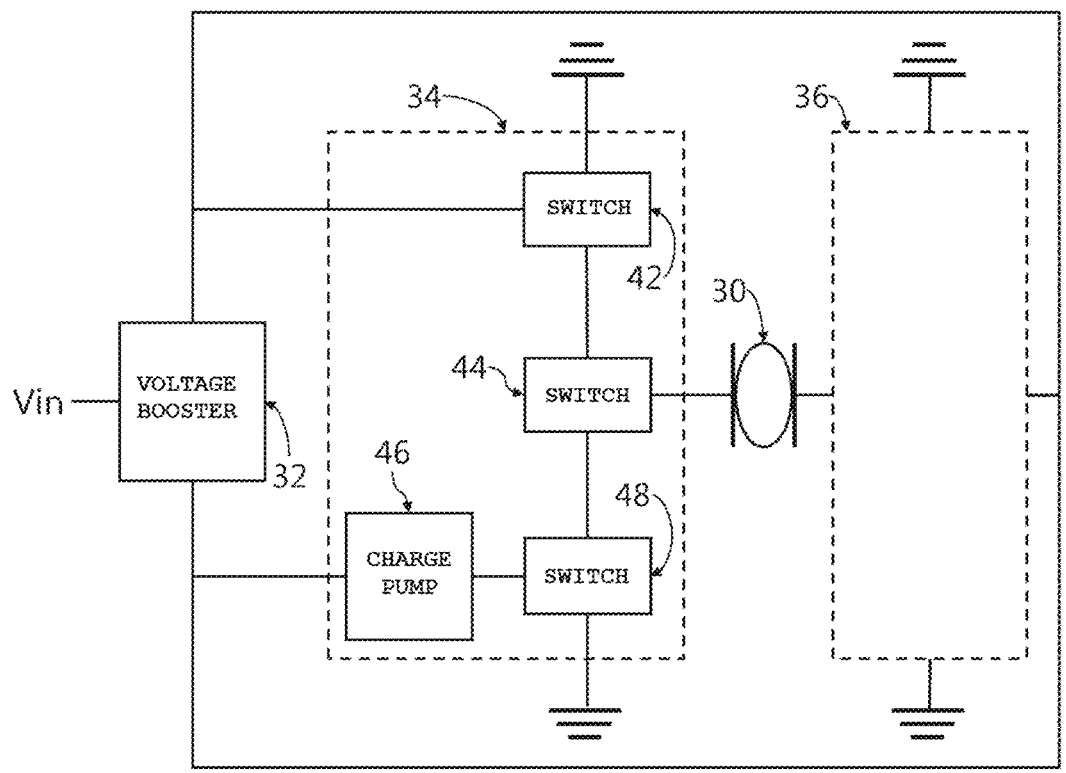

[FIG. 6]
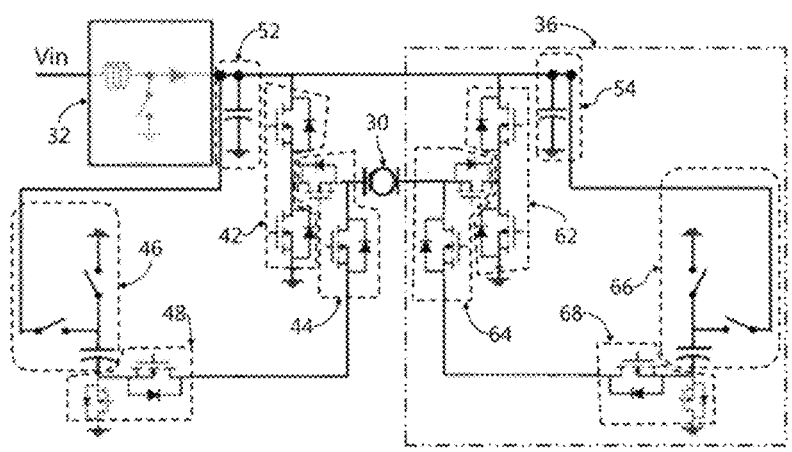
[FIG. 7]
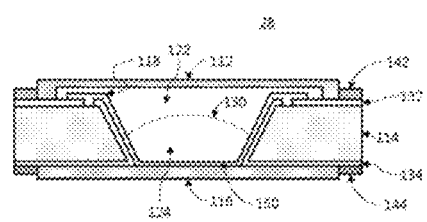

[FIG. 8]
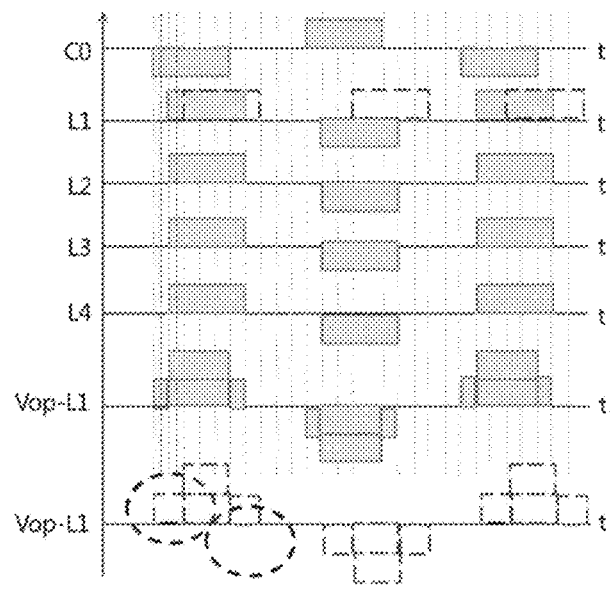
[FIG. 9]
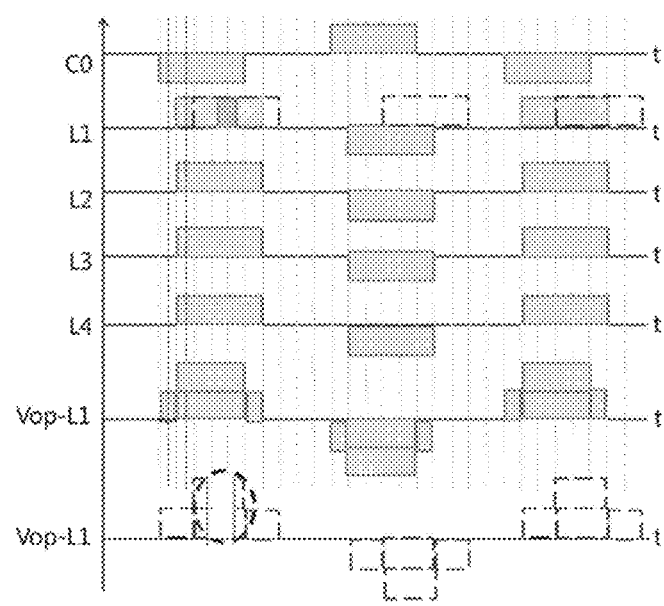

[FIG. 10]
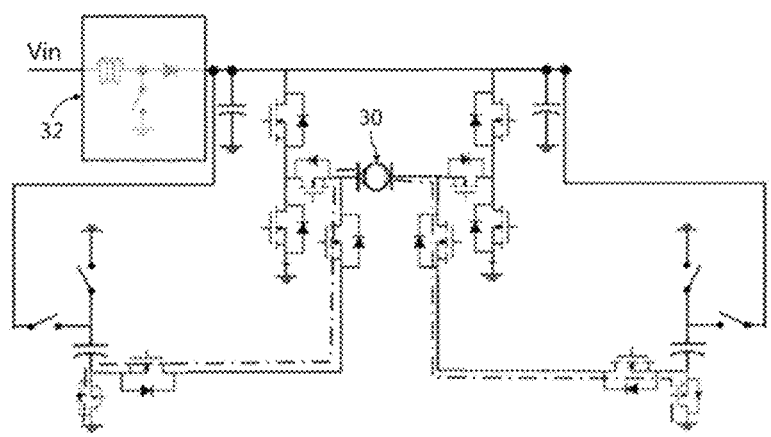
[FIG. 11]
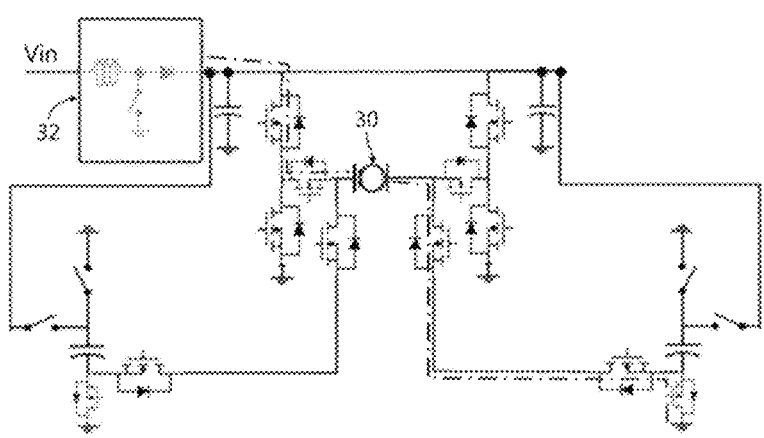

[FIG. 12]
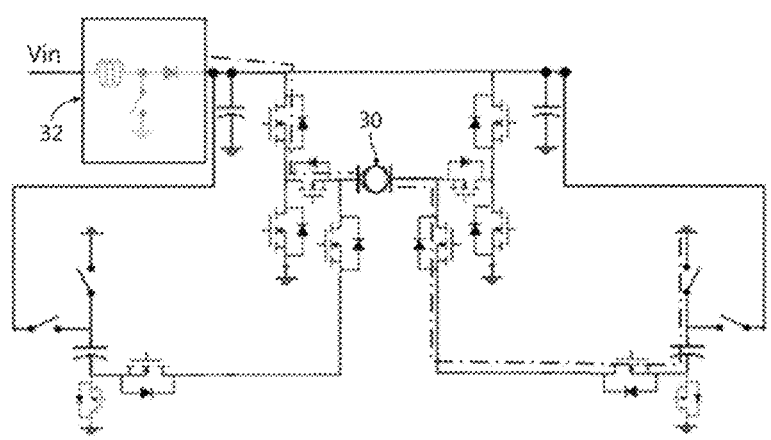
[FIG. 13]
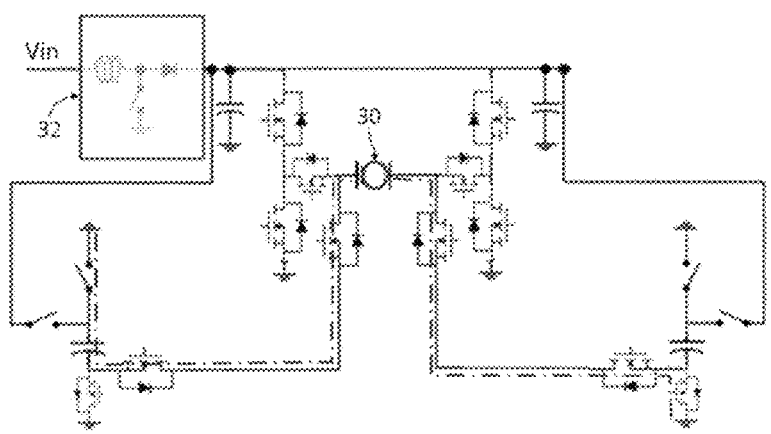

[FIG. 14]
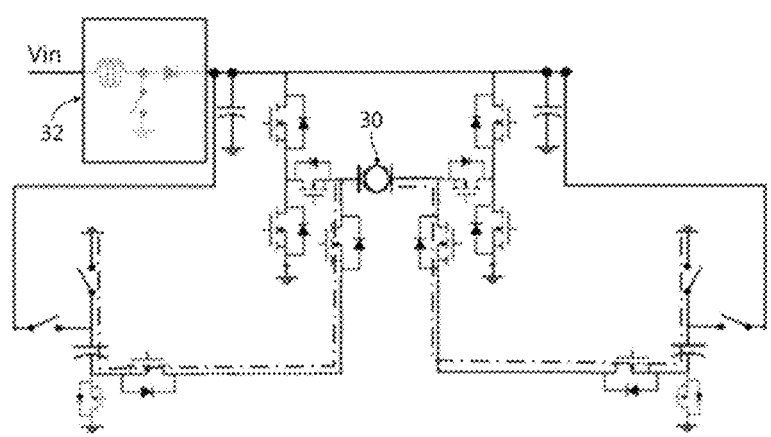
[FIG. 15]
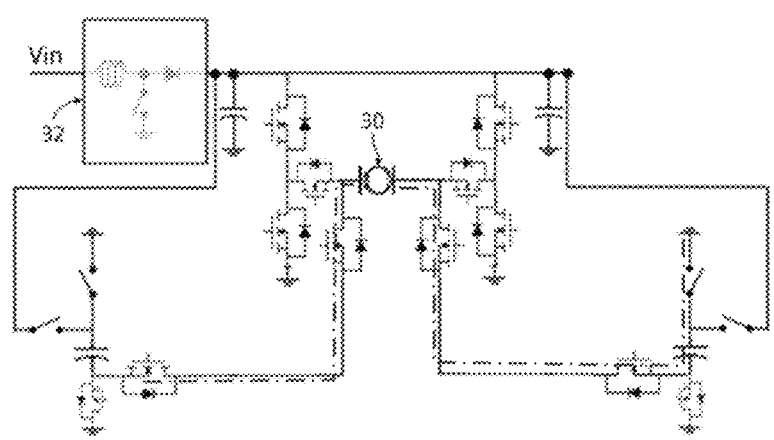

[FIG. 16]
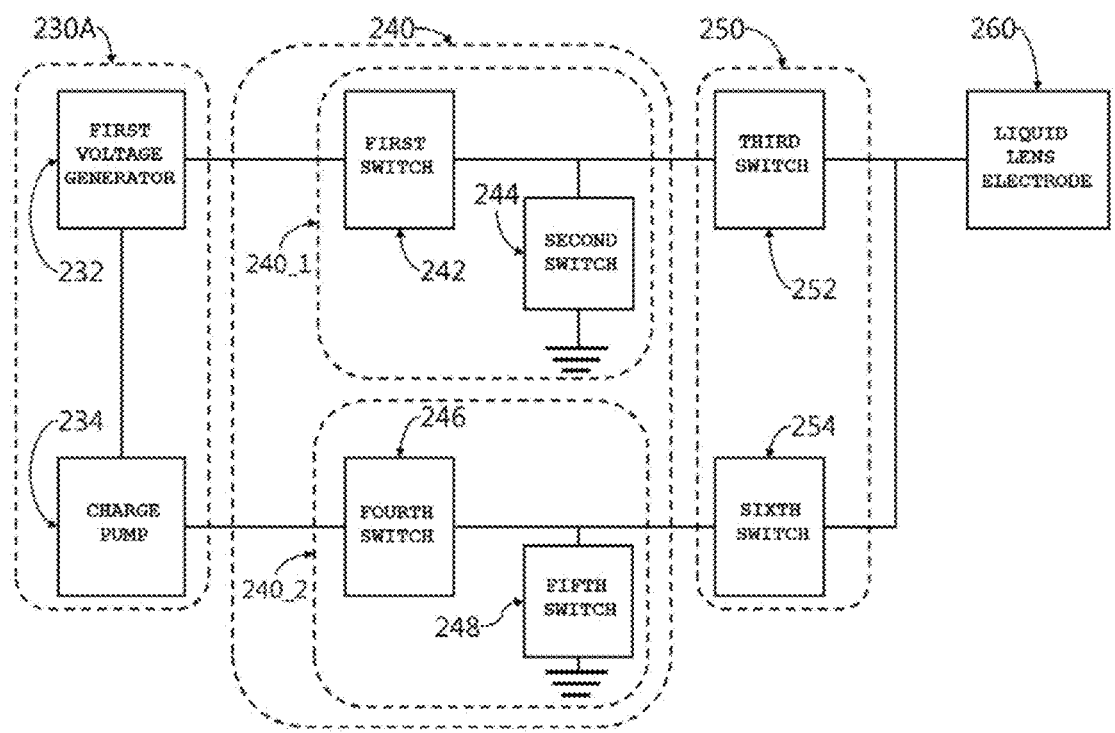

[FIG. 17]
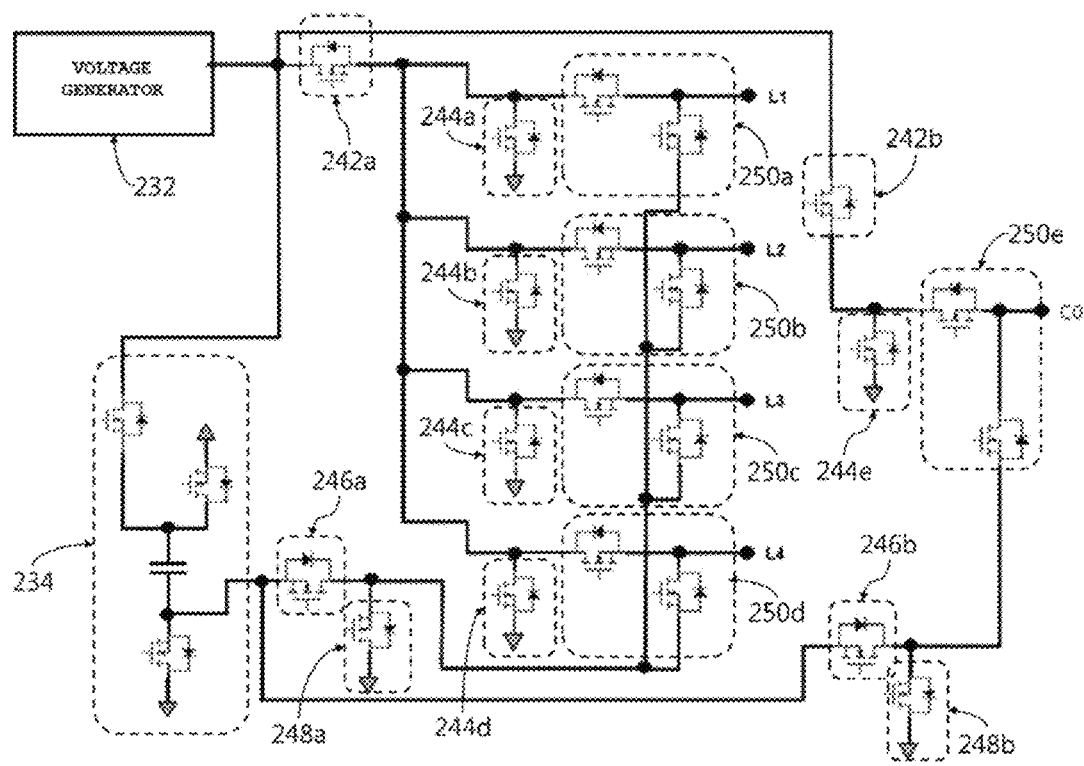

[FIG. 18]
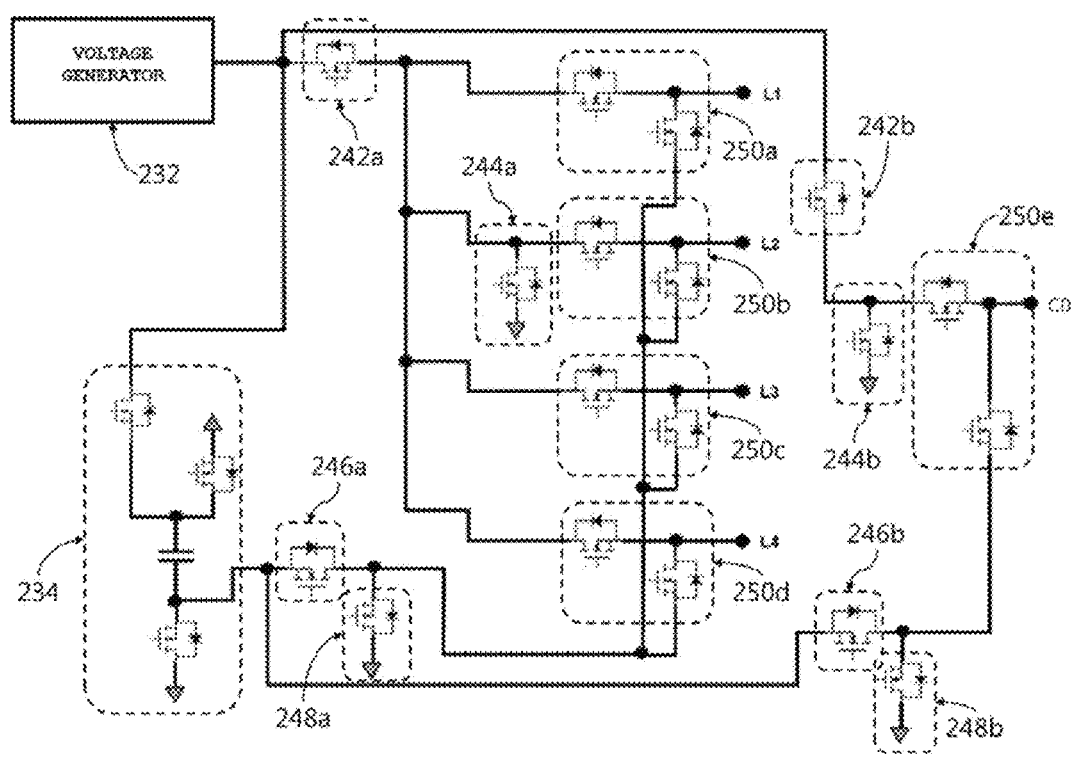

[FIG. 19]
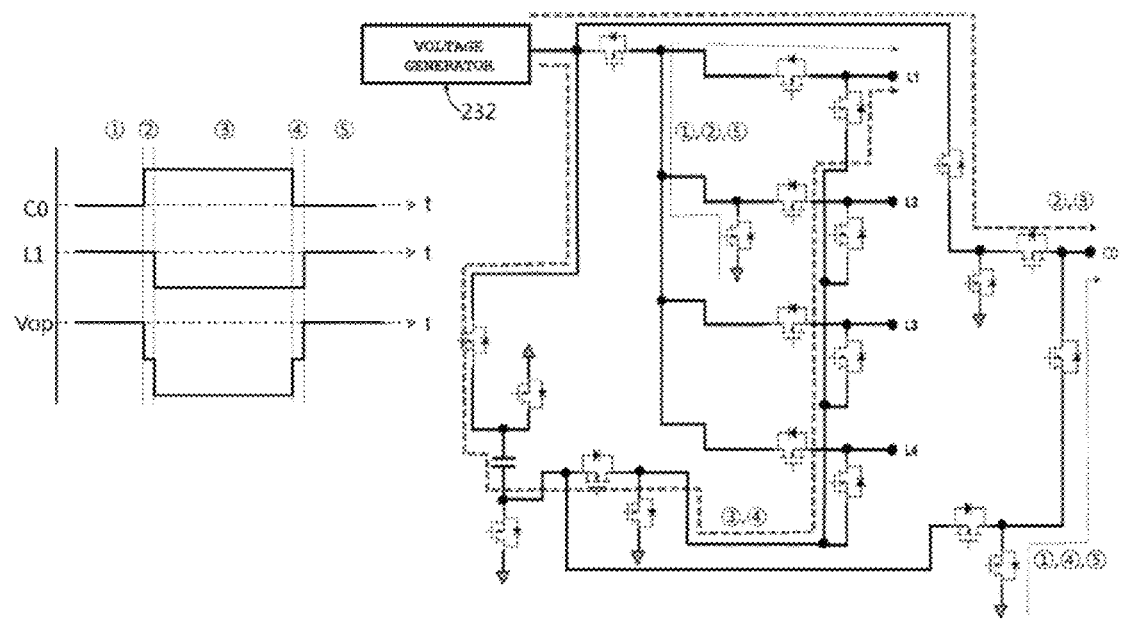

[FIG. 20]
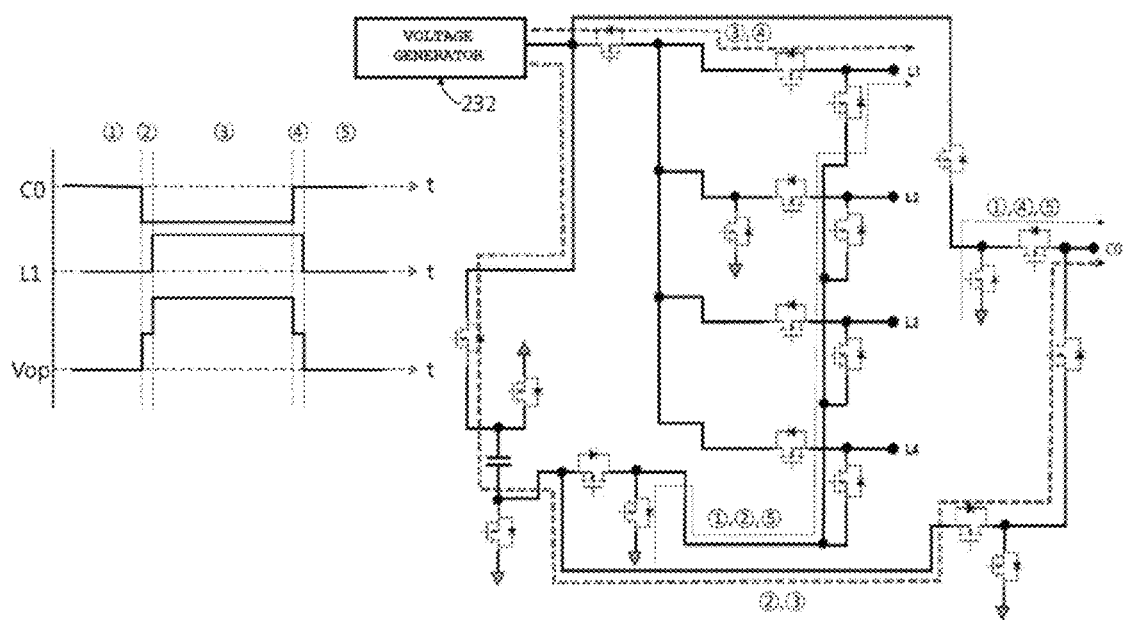

[FIG. 21]
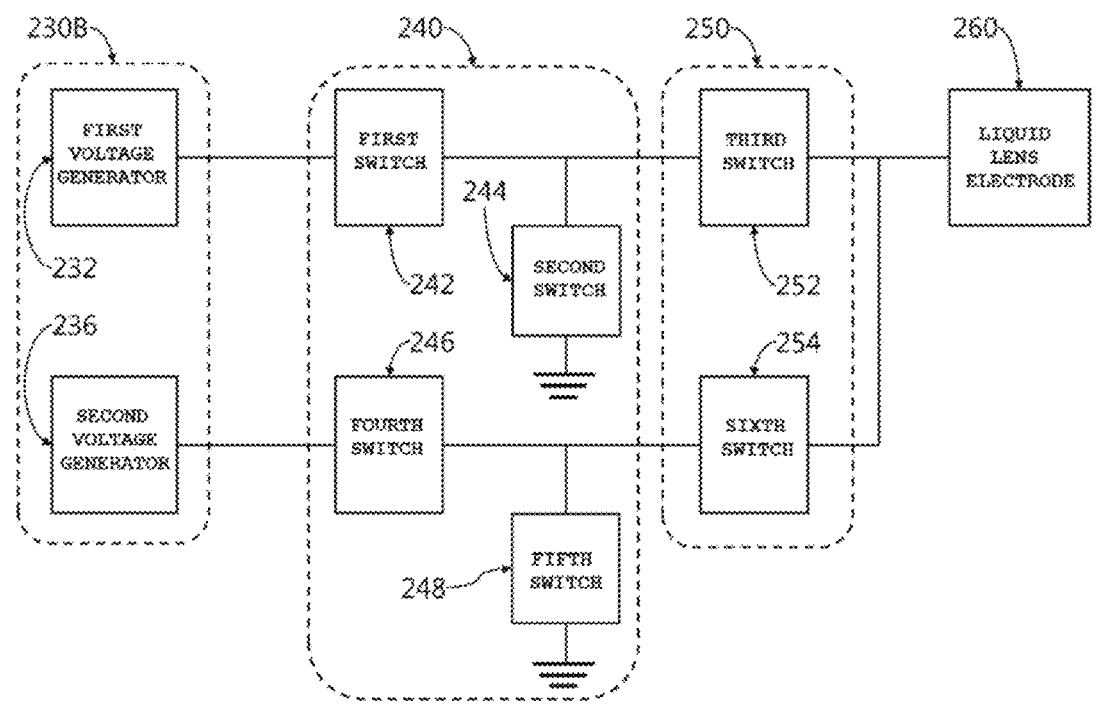

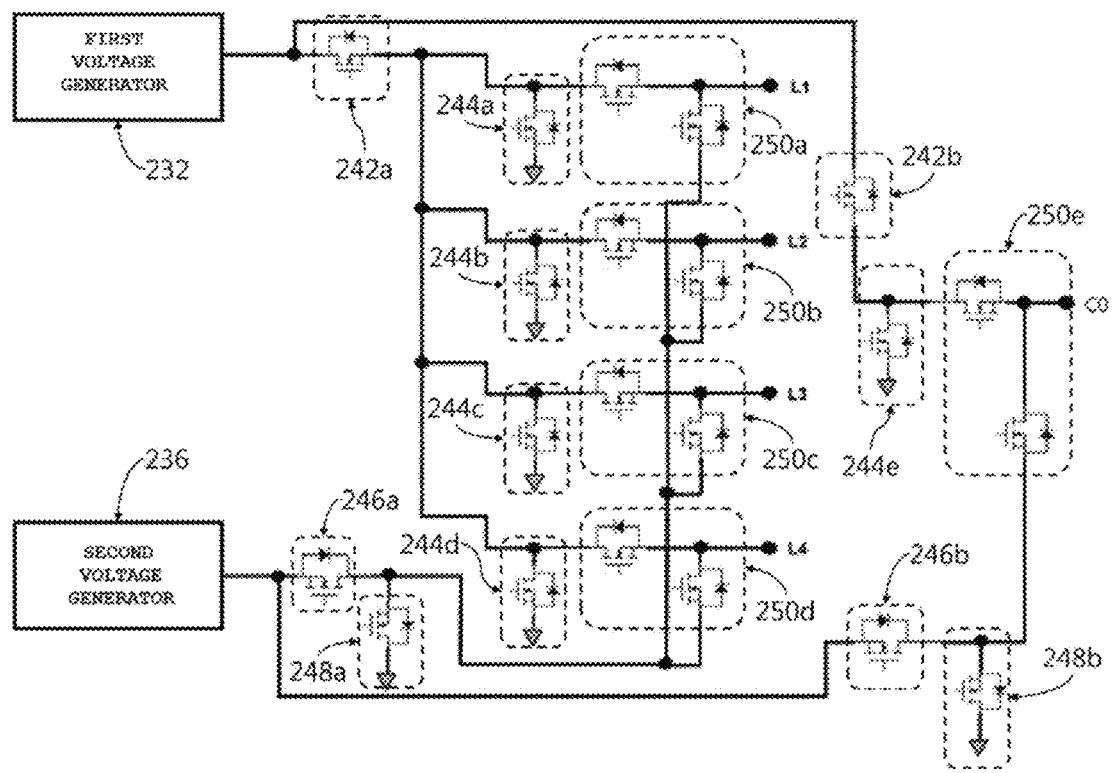
[FIG. 22]

[FIG. 23]
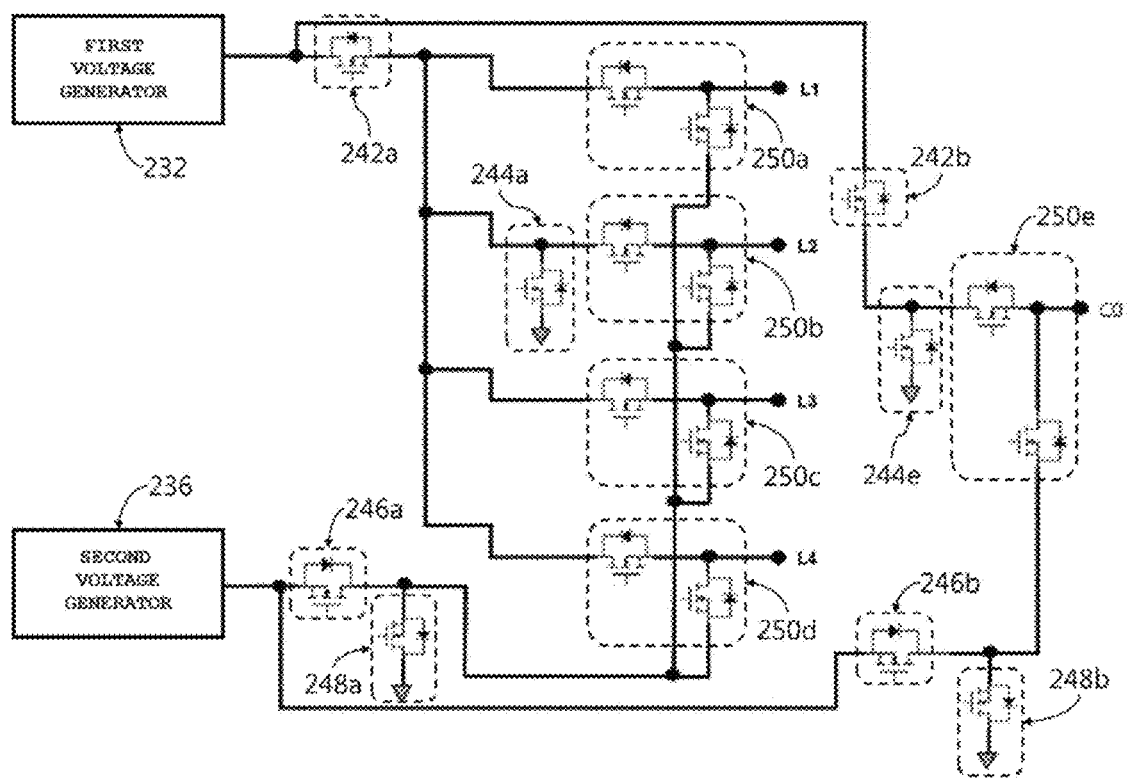

[FIG. 24]
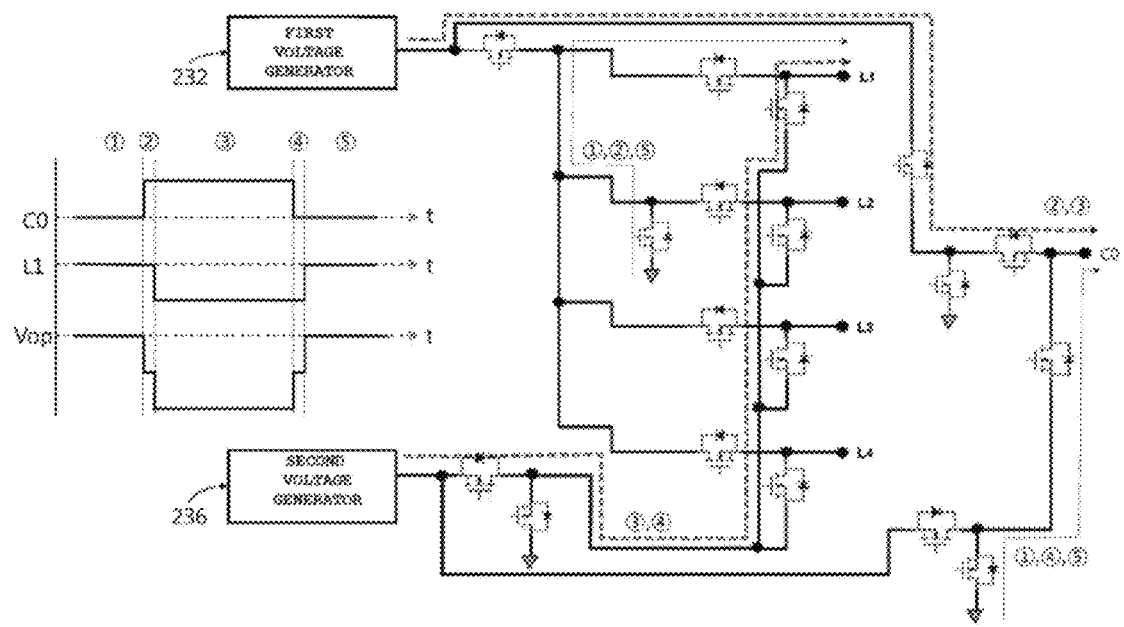

[FIG. 25]
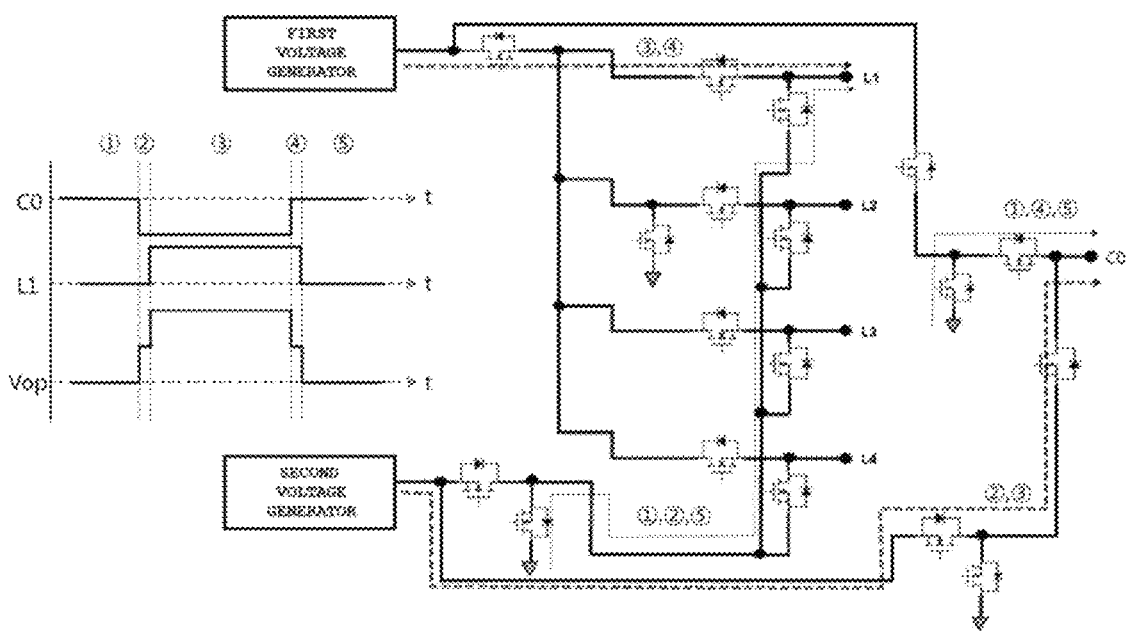

CIRCUIT FOR CONTROLLING VOLTAGE FOR DRIVING LIQUID LENS AND CAMERA MODULE AND OPTICAL DEVICE COMPRISING SAME

CROSS REFERENCE TO RELATED APPLICATIONS

This application is a Continuation of U.S. application Ser. No. 16/345,889, filed Apr. 29, 2019 (now U.S. Pat. No. 10,908,384 issued on Feb. 2, 2021), which is the National Phase of PCT International Application No. PCT/KR2017/012153, filed on Oct. 31, 2017, which claims priority under 35 U.S.C. 119(a) to Patent Application No. 10-2016-0143884, filed in the Republic of Korea on Oct. 31, 2016, and Patent Application No. 10-2017-0025631, filed in the Republic of Korea on Feb. 27, 2017, all of which are hereby expressly incorporated by reference into the present application.

TECHNICAL FIELD

The present invention relates to a circuit for controlling voltage for driving liquid lens, and a camera lens and an optical device including the same. More particularly, the present invention relates to a camera module and an optical device, which include a control module or a control device for controlling a liquid lens adjustable in focal distance using electrical energy.

BACKGROUND ART

Users of portable devices desire an optical device having high resolution, a small size, and various photographing functions (for example, an autofocus (AF) function, a hand tremor correction or optical image stabilizer (OIS) function, and the like). Such photographing functions may be achieved through a method in which several lenses are combined, and the combined lenses are directly moved. When the number of lenses is increased in this case, however, the size of the optical device may be increased. The autofocus function and the hand tremor correction function are carried out as several lens modules held in a lens holder and in an optical axis aligned state are moved or tilted in an optical axis direction or in a direction perpendicular to the optical axis direction. A separate lens driving device is employed to drive the lens module. However, the lens driving device exhibits high power consumption, and increases the overall thickness of the device. To this end, research into a liquid lens performing autofocus and hand tremor correction functions through electrical adjustment of the curvature of an interface between two different liquids is being conducted.

DISCLOSURE

Technical Problem

In the present invention, in a camera module including a lens adjustable in focal distance using electrical energy, a high drive voltage may be generated as a voltage for driving a lens, in spite of use of a low voltage, through use of a switching circuit and a negative voltage, and, as such, the size of an integrated circuit for controlling the lens may be reduced.

In addition, in the present invention, a high voltage for driving a lens may be generated even when a low voltage is supplied to a plurality of terminals of the lens adjustable in focal distance, through alternate supply of a positive voltage and a negative voltage to a common electrode.

Furthermore, in the present invention, it may be possible to more precisely control a drive voltage of a lens adjustable in focal distance, using floating, as compared to pulses of voltages supplied to a common terminal and a plurality of terminals, and, as such, it may be possible to enhance the resolution and range of lens control.

In addition, in the present invention, a circuit for controlling a lens, which is applied to a portable device, and is adjusted in focal distance in accordance with a drive voltage applied to a common terminal and a plurality of terminals, uses a ground voltage as a source voltage, and, as such, it may be possible to reduce power consumption of the circuit and a camera module.

Furthermore, in the present invention, in a portable device equipped with a liquid lens, the number of switching elements included in a control circuit for controlling and driving the liquid lens is reduced and, as such, it may be possible to reduce the size of the control circuit, to reduce manufacturing costs, and to reduce power consumption.

It will be appreciated by persons skilled in the art to which embodiments pertain that technical problems to be solved by the embodiments are not limited to the above-described technical problems, and other technical problems will be more clearly understood from the following description.

Technical Solution

A drive voltage control circuit according to an embodiment of the present invention may include a first voltage generator for outputting a first voltage, a second voltage generator for outputting a second voltage having an opposite polarity to the first voltage, a first switch for selecting one of the first voltage and a ground voltage, and transmitting the selected voltage, a second switch for selecting one of the second voltage and the ground voltage, and transmitting the selected voltage, and a third switch for selecting one of the voltage selected by the first switch and the voltage selected by the second switch, and transmitting the selected voltage, wherein the third switch is plural in number, and the first switch is connected in common to the plural third switches.

The drive voltage control circuit may be operatively connected to a liquid lens including a common electrode and a plurality of individual electrodes and adjustable in focal distance in accordance with application of the first voltage, the second voltage or the ground voltage to the common electrode or the individual electrodes, and the plural third switches may be connected to the plurality of individual electrodes, respectively.

The number of the plurality of individual electrodes may be 4, and the number of the plural third switches may be 4.

The drive voltage control circuit may further include a fourth switch for selecting one of the first voltage and the ground voltage, a fifth switch for selecting one of the second voltage and the ground voltage, and a sixth switch for selecting one of the fourth switch and the fifth switch. The sixth switch may be connected to the common electrode, and the fourth switch and the fifth switch may be connected to the sixth switch.

Furthermore, the second voltage generator may include a charge pump for receiving the first voltage from the first voltage generator, converting a polarity of the received voltage, and outputting the polarity-converted voltage.

In addition, the first voltage may have a positive polarity, and the second voltage generator may output the second voltage, which has the same magnitude as the first voltage while having a negative polarity, independently of the first voltage generator.

The first switch may be disposed in common at the plurality of individual electrodes, and switch elements included in the third switches may be disposed at the plurality of individual electrodes in an independent manner, respectively.

The second switch may be connected in common at the plurality of individual electrodes.

In addition, the liquid lens may include four or eight individual electrodes and one common electrode.

The number of switch elements included in the third switch and the sixth switch may be twice the number of the individual electrodes and the common electrode.

The third switch may include a plurality of first switch elements connected to the individual electrodes in an individual manner, respectively, to selectively transmit the first voltage, and a plurality of second switch elements connected to the individual electrodes in an individual manner, respectively, to selectively transmit the second voltage.

The liquid lens may include four individual electrodes and one common electrode, and the sum of switch elements included in the first to sixth switches may be 18.

The liquid lens may include a first plate including a cavity, in which a conductive liquid and a non-conductive liquid are disposed, a first electrode disposed over the first plate, a second electrode disposed beneath the first plate, the second electrode comprising a plurality of electrode sectors, a second plate disposed over the first electrode, and a third plate disposed beneath the second electrode.

The aspects of the present invention are just a part of preferred embodiments of the present invention. It will be appreciated by persons skilled in the art, to which the present invention pertains, that various embodiments may be derived and understood based on the following detailed description of the present invention.

Advantageous Effects

Effects of the circuit for controlling voltage for driving liquid lens, and a camera lens and an optical device including the same according to the present invention are as follows.

The present invention may achieve a smaller design of elements constituting an integrated circuit to control a lens adjustable in focal distance by generating a drive voltage for the lens using a negative voltage.

In addition, the present invention may reduce the size of a circuit to generate a supply voltage for controlling a lens adjustable in focal distance, and to secure resolution and range in spite of use of a control circuit of low specification, and, as such, it may be possible to enhance productivity and to reduce manufacturing costs.

It will be appreciated by persons skilled in the art that the effects that can be achieved through the present invention are not limited to what has been particularly described hereinabove and other effects of the present invention will be more clearly understood from the following description.

DESCRIPTION OF DRAWINGS

FIG. 1 explains problems of a method for controlling a lens adjustable in focal distance using electrical energy.

FIG. 2 explains an example of a camera module.

FIG. 3 explains an example of a lens assembly included in the camera module.

FIG. 4 explains a lens adjustable in focal distance in accordance with a drive voltage.

FIG. 5 explains a first example of a control circuit.

FIG. 6 explains a second example of the control circuit.

FIG. 7 explains a structure of a liquid lens.

FIG. 8 explains a first method for controlling a lens in a camera device.

FIG. 9 explains a second method for controlling the lens in the camera device.

FIG. 10 explains a first operation mode of a first lens.

FIG. 11 explains a second operation mode of the first lens.

FIG. 12 explains a third operation mode of the first lens.

FIG. 13 explains a fourth operation mode of the first lens.

FIG. 14 explains a fifth operation mode of the first lens.

FIG. 15 explains a sixth operation mode of the first lens.

FIG. 16 explains a third example of the control circuit.

FIG. 17 explains a fourth example of the control circuit.

FIG. 18 explains a fifth example of the control circuit.

FIG. 19 explains a first operation example of the control circuit illustrated in FIG. 18.

FIG. 20 explains a second operation example of the control circuit illustrated in FIG. 18.

FIG. 21 explains a sixth example of the control circuit.

FIG. 22 explains a seventh example of the control circuit.

FIG. 23 explains an eighth example of the control circuit.

FIG. 24 explains a first operation example of the control circuit illustrated in FIG. 23.

FIG. 25 explains a second operation example of the control circuit illustrated in FIG. 23.

BEST MODEL

Hereinafter, preferred embodiments will be described in detail with reference to the accompanying drawings. Although embodiments are susceptible to various modifications and alternative forms, specific embodiments will be shown by way of example in the drawings and will herein be described in detail. It should be understood, however, that there is no intent to limit the invention to the particular forms disclosed, but on the contrary, embodiments are to cover all modifications, equivalents, and alternatives falling within the spirit and scope of embodiments.

In the meantime, although terms including an ordinal number, such as first or second, may be used to describe a variety of constituent elements, the constituent elements are not limited to the terms, and the terms are used only for the purpose of discriminating one constituent element from other constituent elements. In addition, terms specifically defined herein in consideration of the configurations and functions in embodiments are used only to disclose embodiments without limiting the scope of embodiments.

In the following description of embodiments, it will be understood that, when an element is referred to as being "on" or "under" another element, it can be directly on or under the other element or can be indirectly formed such that an intervening element is also present. Furthermore, when the expression "on" or "under" is used herein, it may involve not only the upward direction, but also the downward direction, with reference to one element.

In addition, it will be understood that relative terms used hereinafter such as "on"/"above"/"over" and "under"/"below"/"beneath" may be construed only to distinguish one element from another element without necessarily requiring or involving a certain physical or logical relation or sequence between the elements.

FIG. 1 explains problems of a method for controlling a lens adjustable in focal distance using electrical energy. In detail, FIG. 1(a) explains a control circuit for applying a drive voltage to the lens, and FIG. 1(b) explains a method for applying the drive voltage to the lens.

First, referring to FIG. 1(a), the control circuit may include a voltage booster 12 for receiving a supply voltage VIN, and increasing the level of the supply voltage VIN, a voltage stabilizer 14 for stabilizing an output from the voltage booster 12, and a switching unit 16 for selectively supplying the output from the voltage booster 12 to the lens 10.

In this case, the switching unit 16 includes a configuration of a circuit generally called an "H bridge". A high voltage output from the voltage booster 12 is applied to the switching unit 16 as a source voltage thereof. The switching unit 16 may selectively supply, to both terminals of the lens 10, the source voltage applied to the switching unit 16 and a ground voltage.

Referring to FIG. 1(b), pulse-shaped voltages may be applied to both terminals of the lens 10, that is, a common terminal C0 and an individual terminal L1, respectively. The pulse-shaped voltages may have predetermined widths. A drive voltage Vop applied to the lens 10 is a difference between a voltage applied to the common terminal C0 and a voltage applied to the individual terminal L1. Accordingly, when voltages of the same level are applied to the common terminal C0 and the individual terminal L1, respectively, it may be considered that a drive voltage Vop of 0 V is applied. Referring to FIG. 1(b), it may be considered that, although the same voltage as that of the individual terminal L1 is applied through the common terminal C0, drive voltages Vop1 and Vop2 having pulse widths according to variations in application duration and time of the voltage applied to the individual terminal L1 are applied to both terminals of the lens 10.

Here, the operating voltage output from the voltage booster 12 may have a level of about 70 V. In this case, elements included in the switching unit 16 should be capable of being driven at a high voltage having a level of 70 V. Elements, which should be capable of being driven at high voltage, are difficult to miniaturize. Elements capable of being driven at high voltage should satisfy characteristics such as breakdown voltage, specific on-resistance, safe operating area (SOA), maximum forward voltage and the like. When elements operating at high voltage are manufactured to have an excessively small size, elements such as transistors may be incapable of performing functions such as switching, amplification, and the like. For this reason, there may be a difficulty in miniaturizing the control circuit for supplying a drive voltage for the lens 10. A problem of an increase in manufacturing costs may also occur due to degradation in productivity.

FIG. 2 explains an example of a camera module.

As illustrated, the camera module may include a lens assembly 22 and an image sensor. The lens assembly 22 may include a liquid lens adjustable in focal distance in accordance with a voltage applied thereto. The camera module may include the lens assembly 22, which includes a plurality of lenses including a first lens adjustable in focal distance in accordance with a drive voltage applied between a common terminal and a plurality of individual terminals, a control circuit 24 for supplying a drive voltage to the first lens, and the image sensor 26, which is aligned with the lens assembly 22 and converts light transferred thereto via the lens assembly 22 into an electrical signal.

Referring to FIG. 2, the camera module may include the circuits 24 and 26, which are formed on a single printed circuit board (PCB), and the lens assembly 22 including a plurality of lenses. However, this configuration is only an example, and does not limit the scope of the present invention. The configuration of the control circuit 24 may be differently designed in accordance with specifications required in the camera module or device. In particular, when the magnitude of the operating voltage applied to the lens assembly 22 is reduced, the control circuit 24 may be embodied as a single chip. In this case, it may be possible to further reduce the size of the camera module or device equipped in the portable device.

FIG. 3 explains an example of the lens assembly 22 included in the camera module.

As illustrated, the lens assembly 22 may include a first lens unit 100, a second lens unit 200, a liquid lens unit 300, a lens holder 400, and a connecting stage 366. The illustrated structure of the lens assembly 22 is only an example, and the structure of the lens assembly 22 may be varied in accordance with specifications required in the camera module or device. For example, in the illustrated example, the liquid lens unit 300 is disposed between the first lens unit 100 and the second lens unit 200. In another example, however, the liquid lens unit 300 may be disposed above (in front) the first lens unit 100, or one of the first lens unit 100 and the second lens unit 200 may be omitted.

Referring to FIG. 3, the first lens unit 100 is a part which is disposed in front of the lens assembly, and receives light from the outside of the lens assembly. The first lens unit 100 may be configured using at least one lens, or may form an optical system using two or more lenses aligned with reference to a central axis PL.

The first lens unit 100 and the second lens unit 200 may be mounted in the lens holder 400. In this case, a through hole is formed at the lens holder 400, and the first lens unit 100 and the second lens unit 200 may be disposed in the through hole. In addition, the liquid lens unit 300 may be inserted into a space between the first lens unit 100 and the second lens unit 200 in the lens holder 400.

Meanwhile, the first lens unit 100 may include an exposure lens 110. The exposure lens 110 means a lens protruding outwardly of the lens holder 400 such that the lens is exposed to the outside. In the case of the exposure lens 110, the lens surface thereof may be damaged due to exposure to the outside. If the lens surface is damaged, the quality of an image photographed by the camera module may be degraded. In order to avoid or suppress surface damage to the exposure lens 110, methods of disposing a cover glass on the exposure lens 110, forming a coating layer on the exposure lens 110, or forming the exposure lens 110 using a wear resistant material may be employed. Suitable measures may be needed.

The second lens unit 200 is disposed in rear of the first lens unit 100 and the liquid lens unit 300. Light incident upon the first lens unit 100 from the outside passes through the liquid lens unit 300, and is then incident upon the second lens unit 200. The second lens unit 200 may be disposed in the through hole formed at the lens hole 400 while being spaced apart from the first lens unit 100.

Meanwhile, the second lens unit 200 may be configured using at least one lens, or may form an optical system using two or more multiple lenses aligned with reference to the central axis PL.

The liquid lens unit 300 may be disposed between the first lens unit 100 and the second lens unit 200, and may be inserted into an insertion hole 410 of the lens holder 400. The insertion hole 410 may be formed as a side surface of the lens holder is open at a portion thereof. That is, the liquid lens may be disposed in accordance with insertion thereof into the insertion hole 410 at the side surface of the holder. Similarly to the first lens unit 100 and the second lens unit 200, the liquid lens unit 300 may be aligned with respect to the central axis PL The liquid lens unit 300 may include a lens area 310. The lens area 310 is a part through which light emerging from the first lens unit 100 passes. The lens area 310 may contain a liquid at at least a portion thereof. For example, two kinds of liquids, that is, a conductive liquid and a non-conductive liquid, may be contained in the lens area 310. The conductive liquid and the non-conductive liquid may form an interface without being mixed. The interface between the conductive liquid and the non-conductive liquid may be deformed by a drive voltage applied through the connecting stage 500 and, as such, the curvature and focal distance of the liquid lens unit 300 may be varied. As such interface deformation and radius of curvature are controlled, the liquid lens unit 300, and the lens assembly and the camera module or device, which include the liquid lens unit 300, may perform an autofocus function, a hand tremor correction function, or the like.

FIG. 4 explains a lens adjustable in focal distance in accordance with a drive voltage. In detail, FIG. 4(a) explains a liquid lens 28 included in the lens assembly 22 (cf. FIG. 3), and FIG. 4(b) explains an equivalent circuit of the liquid lens 28.

First, referring to FIG. 4(a), the lens 28, which is adjustable in focal distance in accordance with a drive voltage, may receive an operating voltage via individual terminals L1, L2, L3 and L4. The individual terminals may have the same angular distance, and may include four individual terminals disposed in different directions. When an operating voltage is applied through the individual terminals L1, L2, L3 and L4, the applied operating voltage may cooperate with a voltage applied to a common terminal C0, which will be described later, and, as such, the interface between the conductive liquid and the non-conductive liquid, which are disposed in the lens area 310 may be deformed.

In addition, referring to FIG. 4(b), the lens 28 may be explained as a plurality of capacitors 30, each of which receives, at one side thereof, the operating voltage from a corresponding one of the individual terminals L1, L2, L3 and L4, which differ from one another, while being connected, at the other side thereof, to the common terminal C0. In this case, the plurality of capacitors 30 included in the equivalent circuit may have small capacitance of about 200 picofarads (pF).

FIG. 5 explains a first example of the control circuit. Here, the control circuit is a circuit for applying an operating voltage to the lens 28 (cf. FIG. 4), which is adjustable in focal distance in accordance with a drive voltage. This will be explained using an equivalent circuit. The lens 28 may be explained as including a plurality of capacitors 30, and the individual terminals L1, L2, L3 and L4 respectively supplying the operating voltage to corresponding ones of the capacitors 30 may be independently controllable. For convenience of description, in the following description, the control circuit will be explained in conjunction with, for example, one capacitor 30 connected to one individual terminal.

As illustrated, the control circuit may include an individual terminal control unit 34 and a common terminal control unit 36. The individual terminal control unit 34 and the common terminal control unit 36 may receive a ground voltage while receiving, from a voltage booster 32, an operating voltage having a magnitude corresponding to ½ of the drive voltage. In the present disclosure, the ground voltage may be a reference potential in the control circuit. The ground voltage may be a reference voltage of the control circuit. The individual terminal control unit 34 may supply, to the individual terminals of the capacitors 30, the operating voltage in the form of a positive voltage and a negative voltage. The common terminal control unit 36 may supply, to the common terminal of the capacitors 30, the operating voltage in the form of a positive voltage and a negative voltage. Assuming that the ground voltage and the reference potential or reference voltage are 0 V, the individual terminal control unit 34 may supply, to the individual terminals, the operating voltage in the form of a positive voltage and a negative voltage. In this case, the common terminal controller 36 may supply, to the common terminal of the capacitors 30, the operating voltage in the form of a positive voltage and a negative voltage. The individual terminal control unit 34 and the common terminal control unit 36 may have substantially the same configuration. Hereinafter, the individual control unit 34 may be explained in more detail.

The individual terminal control unit 34 may include a charge pump 46 for adjusting the operating voltage supplied from the voltage booster 32 to have the form of a negative voltage. In addition, the individual terminal control unit 34 may include a switching unit including a plurality of switches. The switching unit may include a first switch 42 for selecting one of the ground voltage and the operating voltage, a second switch 48 for selecting one of an output from the charge pump 46 and the ground voltage, and a third switch 44 for selecting one of an output from the first switch 42 and an output from the second switch 48, and applying the selected output to the individual terminals of the capacitors 30. In this case, each of the first switch 42, the second switch 48 and the third switch 44 may include at least one transistor. In addition, each switch may include two switches.

Meanwhile, the first switch 42 and the second switch 48 in the individual terminal control unit 34 may consider the ground voltage as another input stage and, as such, may determine the operating voltage applied to the common terminal or the individual terminals of the capacitors 30.

In addition, the control circuit may further include the voltage booster 32, which converts a supply voltage Vin to have a magnitude corresponding to that of the operating voltage. For example, the supply voltage input to the voltage booster 32 may have a level of 2.5 V to 3.0 V, and the operating voltage output from the voltage booster 32 may have a level of 30 V to 40 V. Here, the supply voltage input to the voltage booster 32 may be an operating voltage of a portable device or an optical device equipped with a camera module or device.

Meanwhile, the individual terminal control unit 34 and the common terminal control unit 36 may transmit the ground voltage to a part of the control units 34 and 36 for controlling the liquid lens 28, in a period in which the liquid lens 28 is not driven. In this case, it may be possible to reduce an increase in power consumption, as compared to the case in which the output from the voltage booster 32, namely, a high voltage, is applied to the control units 34 and 36, in the period in which the high voltage is not used.

FIG. 6 explains a second example of the control circuit.

As illustrated, the control circuit connected to the voltage booster 32, which receives the supply voltage Vin, thereby outputting the operating voltage, may control the voltage applied to the individual terminals of the capacitors 30.

The control circuit may include a first voltage stabilizer 52 for stabilizing an output from the voltage booster 32. In addition, the output from the voltage booster 32 may be transmitted to the first charge pump 46. The first charge pump 46 may include a first element for selectively transmitting the ground voltage, a second element for selectively transmitting the operating voltage, and a first capacitor disposed between outputs of the first and second elements and the switching unit. Here, the first and second elements may be embodied as transistors.

Meanwhile, the first switch 42, which selects one of the ground voltage and the operating voltage, may include a third element for selectively transmitting the ground voltage, and a fourth element for selectively transmitting the operating voltage.

In addition, the second switch 48, which selects one of an output from the first charge pump 48 and the ground voltage, may include a fifth element for selectively transmitting the output from the first charge pump 46, and a sixth element for selectively transmitting the ground voltage.

Accordingly, both the first switch 42 and the second switch 48 may selectively transmit the ground voltage. Since both the first switch 42 and the second switch 48 may transmit the ground voltage as the operating voltage applied to one side of each capacitor 30, one of the first switch 42 and the second switch 48 may be connected to the ground voltage when the other of the first switch 42 and the second switch 48 transmits the operating voltage and, as such, an operating voltage in the form of a positive voltage or a negative voltage may be applied. Each capacitor 30 corresponding to the interface of the liquid lens operates in accordance with an absolute value of the operating voltage and, as such, polarities of the operating voltage in the form of a positive voltage or a negative voltage may have no influence on movement of the interface.

In addition, the third switch 44, which selects one of the output from the first switch 42 and the output from the second switch 48, and applies the selected output to the individual terminals of the capacitors 30, may include a seventh element for selectively transmitting the output from the first switch 42, and an eighth element for selectively transmitting the output from the second switch 48.

Furthermore, the control circuit may include the common terminal control unit 36. The common terminal control unit 36 may include a second voltage stabilizer 54, a second charge pump 66, a fourth switch 62, a fifth switch 68, and a sixth switch 64. In this case, the second voltage stabilizer 54 may have the same configuration as the first voltage stabilizer 54, and the second charge pump 66 may have the same configuration as the first charge pump 46. In addition, the fourth switch 62 may have the same configuration as the first switch 42, the fifth switch 68 may have the same configuration as the second switch 48, and the sixth switch 64 may have the same configuration as the third switch 44.

FIG. 7 explains a structure of the liquid lens.

As illustrated, the liquid lens 28 may include liquids, a first plate, and electrodes. Liquids 122 and 124, which are included in the liquid lens 28 may include a conductive liquid and a non-conductive liquid. The first plate may include a cavity 150 in which the conductive liquid and the non-conductive liquid are disposed. The cavity 150 may include an inclined surface. Electrodes 132 and 134 may be disposed on the first plate 114 and may be disposed on a top portion of the first plate 114 or a bottom portion of the first plate 114. The liquid lens 28 may further include a second plate 112, which may be disposed on top portions (bottom portions) of the electrodes 132 and 134. In addition, the liquid lens 28 may further include a third plate 116, which may be disposed on the bottom portions (top portions) of the electrodes 132 and 134. As illustrated, an embodiment of the liquid lens 28 may include an interface 130 formed by the two different liquids 122 and 124. In addition, the liquid lens 28 may include one or more substrates 142 and 144 for supplying a voltage to the liquid lens 28. The liquid lens 28 may have a smaller thickness at corners thereof than at a central portion thereof.

The liquid lens 28 includes two different liquids, for example, a conductive liquid 122 and a non-conductive liquid 124, and the curvature and shape of the interface 130 formed by the two liquids may be adjusted by a drive voltage supplied to the liquid lens 28. The drive voltage supplied to the liquid lens 28 may be transmitted via the first substrate 142 and the second substrate 144. The second substrate 144 may transmit four individual drive voltages, and the first substrate 142 may transmit one common voltage. The voltages supplied via the second substrate 144 and the first substrate 142 may be applied to a plurality of electrodes 134 and 132 exposed at respective corners of the liquid lens 28, respectively.

In addition, the liquid lens 28 may include the third plate 116 and the second plate 112, which include transparent materials, respectively, and the first plate 114, which is disposed between the third plate 116 and the second plate 112, and includes an opening area having a predetermined inclined surface.

Furthermore, the liquid lens 28 may include the cavity 150, which is defined by the third plate 116, the second plate 112 and the opening area of the first plate 114. In this case, the cavity 150 may be filled with the two liquids 122 and 124, which have different properties (for example, a conductive liquid and a non-conductive liquid). The interface 130 may be formed between the two liquids 122 and 124 having different properties.

In addition, at least one of the two liquids 122 and 124 included in the liquid lens 28 may have conductivity. The liquid lens 28 may further include an insulating layer 118 disposed on the two electrodes 132 and 134 respectively disposed on the top and bottom portions of the first plate 114 and the inclined surface, with which the conductive liquid may be in contact. In this case, the insulating layer 118 may cover one of the two electrodes 132 and 134 (for example, the second electrode 134) while allowing a portion of the other electrode (for example, the first electrode 132) to be exposed therethrough such that electrical energy may be applied to the conductive liquid (for example, "122"). In this case, the first electrode 132 may include at least one electrode sector (for example, "C0"), and the second electrode 134 may include two or more electrode sectors (for example, "L1", "L2", "L3" and "L4" in FIG. 4). For example, the second electrode 134 may include a plurality of electrode sectors sequentially disposed around an optical axis in a clockwise direction.

One or at least two substrates 142 and 144 may be connected to the two electrodes 132 and 134 included in the liquid lens 28 in order to transmit a drive voltage to the electrodes 132 and 134. The interface 130 formed in the liquid lens 28 is varied in curvature, inclination and the like in accordance with the drive voltage and, as such, the focal distance of the liquid lens 28 may be adjusted.

FIG. 8 explains a first method for controlling the lens in the camera device.

As illustrated, four individual electrodes L1, L2, L3 and L4, and a common electrode C0 may be connected to the lens. Operating voltages supplied to the four individual electrodes L1, L2, L3 and L4 may be independently controlled, and may differ from one another. Here, for convenience of description, the applied voltages have been described as having the same pulse shape (having a predetermined time width).

Operating voltages having the form of a positive voltage and a negative voltage may be supplied not only to the individual electrodes L1, L2, L3 and L4 of the liquid lens, but also to the common electrode C0 of the liquid lens. For example, when voltages of the same level are supplied to the individual electrode L1 and the common electrode C0, respectively, the voltage difference between the two electrodes is 0 V. However, when one of the voltages having the same level is a positive voltage, and the other of the voltages is a negative voltage, the voltage difference between the two electrodes may be twice the operating voltages. When this principle is utilized, it is unnecessary for the voltage booster 32 (cf. FIG. 5) connected to the control circuit to output a high voltage of 70 V. Even when the voltage booster 32 outputs a voltage of 35 V, the control circuit may perform control such that the difference between the voltages applied to the two electrodes of the lens becomes 70 V.

When this method is used, the drive voltage, Vop-L1, applied between the two electrodes of the lens (the individual electrode L1 and the common electrode C0) may include a first voltage (for example, +35 V) when an operating voltage (for example, 35 V) is applied in the form of a negative voltage to the common electrode C0 and a ground voltage is applied to the individual electrode (for example, "L1"), a second voltage (for example, +70 V) when the operating voltage is applied in the form of a negative voltage to the common electrode C0 and the operating voltage is applied in the form of a positive voltage to the individual electrode (for example, "L1"), a third voltage (for example, +35 V) when the ground voltage is applied to the common electrode C0 and the operating voltage is applied in the form of a positive voltage to the individual electrode (for example, "L1"), a fourth voltage (for example, −35 V) when the operating voltage is applied in the form of a positive voltage to the common electrode C0 and the ground voltage is applied to the individual electrode (for example, "L1"), a fifth voltage (for example, −70 V) when the operating voltage is applied in the form of a positive voltage to the common electrode C0 and the operating voltage is applied in the form of a negative voltage to the individual electrode (for example, "L1"), and a sixth voltage (for example, −35 V) when the ground voltage is applied to the common electrode C0 and the operating voltage is applied in the form of a negative voltage to the individual electrode (for example, "L1"), The above-described drive voltage Vop-L1 may be varied in accordance with whether operating voltages applied to the individual electrodes L1, L2, L3 and L4 and the common electrode C0 have the form of a positive voltage or a negative voltage.

FIG. 9 explains a second method for controlling the lens in the camera device.

As illustrated, the control circuit may float operating voltages applied to the individual electrodes L1, L2, L3 and L4 or the common electrode C0 for a predetermined time. For example, the control circuit may control connection of the first switch 42 (cf. FIG. 5) or the second switch 48 (cf. FIG. 5).

The control circuit may generate the above-described floating in a period in which the operating voltages are supplied to the common electrode and the plurality of individual electrodes in opposite directions, respectively. For example, referring to FIG. 8, an operating voltage in the form of a positive voltage is applied to the individual electrode L1 of the lens and an operating voltage in the form of a negative voltage is applied to the common electrode C0 and, as such, connection of the individual electrode L1 may be floated during application of a drive voltage Vop-L1 corresponding to twice the operating voltages across the lens. When connection of the individual electrode L1 is floated, there is no drive voltage Vop-L1 applied across the lens for a time corresponding to the floating.

Operating voltages having predetermined pulse widths may be applied to the common electrode C0 and the individual electrodes L1, L2, L3 and L4, respectively. In order to maintain and generate such pulse widths, however, it is necessary to provide a separate circuit such as a phase locked loop (PLL). For generation of an operation voltage having a pulse width narrowed on the basis of time while having a correct phase (pulse width), manufacturing costs may be increased. Accordingly, the floating of a common electrode or a plurality of individual electrodes may generate a pulse signal having a high frequency without using a phase locked loop (PLL) generating a pulse signal having a high frequency.

FIGS. 10 to 15 explain operation modes of the first lens. In detail, FIG. 10 explains a first operation mode of the first lens, FIG. 11 explains a second operation mode of the first lens, and FIG. 12 explains a third operation mode of the first lens. In addition, FIG. 13 explains a fourth operation mode of the first lens, FIG. 14 explains a fifth operation mode of the first lens, and FIG. 15 explains a sixth operation mode of the first lens. Paths, along which a drive voltage is applied, in the first to sixth operation modes are indicated by separate lines (dash-dotted lines).

Referring to FIG. 10, in the first operation mode, the ground voltage is applied across the capacitor 30, that is, an equivalent circuit which may be disposed between each individual electrode and the common electrode in the lens 28. Switches (or transistors) on a path, along which the ground voltage is applied, may be turned on, and other switches (or transistors) may be turned off.

Referring to FIG. 11, in the second operation mode, an operating voltage (positive voltage) output from the voltage booster 32 is applied to one side of the capacitor 30, that is, an equivalent circuit which may be disposed between each individual electrode and the common electrode in the lens 28, and the ground voltage is applied to the other side of the capacitor 30. Switches (or transistors) on paths, along which the operating voltage (positive voltage) and the ground voltage are applied, respectively, may be turned on, and other switches (or transistors) may be turned off.

Referring to FIG. 12, in the third operation mode, the operating voltage output from the voltage booster 32 in the form of a positive voltage is applied to one side of the capacitor 30, that is, an equivalent circuit which may be disposed between each individual electrode and the common electrode in the lens 28, and the operating voltage output from the voltage booster 32 is applied to the other side of the capacitor 30 in the form of a negative voltage after passing through a charge pump. Switches (or transistors) on paths, along which the operating voltages in the form of a positive voltage and a negative voltage are applied, respectively, may be turned on, and other switches (or transistors) may be turned off.

Referring to FIG. 13, in the fourth operation mode, the operating voltage output from the voltage booster 32 is applied in the form of a negative voltage to one side of the capacitor 30, that is, an equivalent circuit which may be disposed between each individual electrode and the common electrode in the lens 28, after passing through the charge pump, and the ground voltage is applied to the other side of the capacitor 30. Switches (or transistors) on paths, along which the operating voltage in the form of a negative voltage and the ground voltage are applied, respectively, may be turned on, and other switches (or transistors) may be turned off.

Referring to FIG. 14, in the fifth operation mode, the operating voltage output from the voltage booster 32 is applied in the form of a negative voltage across the capacitor 30, that is, an equivalent circuit which may be disposed between each individual electrode and the common electrode in the lens 28, after passing through the charge pump. Switches (or transistors) on paths, along which the operating voltage in the form of a negative voltage is applied, may be turned on, and other switches (or transistors) may be turned off.

Referring to FIG. 15, in the sixth operation mode, one side of the capacitor 30, that is, an equivalent circuit which may be disposed between each individual electrode and the common electrode in the lens 28, is floated, and an operating voltage output from the voltage booster 32 is applied to the other side of the capacitor 30 in the form of a negative voltage after passing through the charge pump. In this case, although a voltage is applied to the other side of the capacitor 30, the drive voltage may be 0 V because one side of the capacitor 30 is in a floated state. Switches (or transistors) on a floating path may be turned off.

Meanwhile, the switches floated in FIG. 15 are those selected when the sixth operation mode is carried out following the fifth operation mode shown in FIG. 14. If the floating mode occurs immediately after completion of one of other operation modes, switches to be floated may be changed.

When the control circuit includes a plurality of switches, it may be possible to adjust the magnitude and direction of the drive voltage applied to the lens only through on/off control of the switches, in the aforementioned first to sixth operation modes.

FIG. 16 explains a third example of the control circuit.

As illustrated, the control circuit may include a drive voltage output unit 230A for outputting a voltage of a predetermined magnitude having a polarity (positive polarity or negative polarity), a first switching unit 240 for selectively transmitting one of the voltage received from the drive voltage output unit 230A and a ground voltage (earth voltage), and a second switching unit 250 for selectively transmitting the drive voltage received from the first switching unit 240 to an electrode 260 of the liquid lens 28 (cf. FIG. 7).

The drive voltage output unit 230A may include a first voltage generator 232 for performing voltage boosting to a predetermined magnitude, based on a source voltage or a supply voltage, thereby outputting a first voltage, and a charge pump 234 for receiving the first voltage from the first voltage generator 232, converting the polarity of the first voltage, and outputting the polarity-converted voltage as a second voltage. For example, when the first voltage is a positive voltage, the second voltage is a negative voltage. In accordance with an embodiment, the polarities of the first voltage and the second voltage may be reversed.

The first switching unit 240 may include a first sub-switching unit 240_1 and a second sub-switching unit 240_2. The first sub-switching unit 240_1 may output one of the first voltage and the ground voltage, and the second sub-switching unit 240_2 may output one of the second voltage having an opposite polarity to the first voltage and the ground voltage. The first sub-switching unit 240_1 and the second sub-switching unit 240_2 may have similar configurations. In accordance with an embodiment, the first sub-switching unit 240_1 and the second sub-switching unit 240_2 may have different configurations.

In detail, the first switching unit 240 may include a first switch 242, which may selectively transmit the first voltage received from the first voltage generator 232, and a second switch 244, which may selectively transmit a first ground voltage. In addition, the first switching unit 240 may further include a fourth switch 246, which may selectively transmit the second voltage received from the charge pump 234, and a fifth switch 248, which may selectively transmit a second ground voltage.

The first switching unit 240 may include two different input stages and two different output stages. In addition, the first ground voltage and the second ground voltage may be electrically connected.

The second switching unit 250 may include a third switch 252, which, upon receiving one of the first voltage and the first ground voltage, may selectively supply the received voltage to the liquid lens electrode 260, and a sixth switch 254, which, upon receiving one of the second voltage and the second ground voltage, may selectively supply the received voltage to the liquid lens electrode 260.

The first switching unit 240 may be disposed in common at electrodes included in the liquid lens 28. For example, the first switching unit 240 is shared among a plurality of individual electrodes included in the liquid lens and, as such, a drive voltage may be transmitted to the plurality of individual electrodes via at least one first switching unit 240.

On the other hand, it is necessary for the second switching unit 250 to be individually disposed at each of the electrodes included in the liquid lens 28. For example, independent second switching units 250 may be connected to the plurality of individual electrodes included in the liquid lens 28, respectively. In this regard, the second switching unit 250 may not be shared among liquid lens electrodes 260.

FIG. 17 explains a fourth example of the control circuit.

As illustrated, the control circuit may include a voltage generator 232 for generating a voltage having a predetermined polarity and a predetermined magnitude, a charge pump 234 for converting the polarity of the voltage generated in the voltage generator 232, a plurality of switching elements 242a, 242b, 244a, 244b, 244c, 244d, 244e, 246a, 246b, 248a, and 248b for transmitting a drive voltage to a plurality of electrodes L1, L2, L3, L4 and C0 included in the liquid lens, and a plurality of second switching units 250a, 250b, 250c, 250d, and 250e for selectively transmitting the voltages received from the plurality of switching elements to the plurality of electrodes L1, L2, L3, L4 and C0 included in the liquid lens. Here, the plurality of switching elements 242a, 242b, 244a, 244b, 244c, 244d, 244e, 246a, 246b, 248a, and 248b may correspond to the first switching unit 240 explained in FIG. 8. The voltage generator 232 may include a voltage booster and the like.

In accordance with the control circuit explained in FIG. 8, six switch elements may be connected to each liquid lens electrode 260, except for three switch elements included in the charge pump 234. In the control circuit explained in FIG. 17, however, a part of the switch elements disposed at the individual electrodes L1, L2, L3 and L4 among the plurality of electrodes L1, L2, L3, L4 and C0 included in the liquid lens, is connected in common and, as such, the number of switch elements may be reduced. For example, when the liquid lens includes four individual electrodes and one common electrode, the control circuit explained in FIG. 16 may include a total of 30 (5×6) switching elements, whereas the control circuit explained in FIG. 17 may include a total of 21 switching elements.

FIG. 18 explains a fifth example of the control circuit.

As illustrated, the control circuit may include a voltage generator 232 for generating a voltage having a predetermined polarity and a predetermined magnitude, a charge pump 234 for converting the polarity of the voltage generated in the voltage generator 232, a plurality of switching elements 242a, 242b, 244a, 244b, 246a, 246b, 248a, and 248b for transmitting a drive voltage to a plurality of electrodes L1, L2, L3, L4 and C0 included in the liquid lens, and a plurality of second switching units 250a, 250b, 250c, 250d, and 250e for selectively transmitting the voltages received from the plurality of switching elements to the plurality of electrodes L1, L2, L3, L4 and C0 included in the liquid lens. Here, the plurality of switching elements 242a, 242b, 244a, 244b, 246a, 246b, 248a, and 248b may correspond to the first switching unit 240 explained in FIG. 16.

When the liquid lens includes four individual electrodes and one common electrode, the control circuit explained in FIG. 18 may include 18 switching elements while the control circuit explained in FIG. 9 may include 21 switching elements, except for three switching elements included in the charge pump 234. It may be possible to further reduce the number of switching elements included in the control circuit, as in FIG. 18, through a method of connecting, in common, the switching elements for selectively transmitting a ground voltage to respective individual elements included in the liquid lens, without individually disposing the switching elements to respective individual elements. As the number of switching elements is reduced, it may be possible to reduce the size of the entirety of the control circuit while reducing power consumption of the control circuit.

Referring to FIG. 18, the number of the plurality of switching elements 242a, 242b, 244a, 244b, 246a, 246b, 248a, and 248b corresponding to the first switching unit 240 explained in FIG. 8 may be fixed, irrespective of the number of electrodes included in the liquid lens. For example, it may be possible to embody the first switching unit 240 explained in FIG. 8 using only eight switching elements, irrespective of the case in which the number of individual electrodes included in the liquid lens is 4, 8, 12, or 16. On the other hand, the number of switching elements included in the plurality of second switching units 250a, 250b, 250c, 250d, and 250e may correspond to the number of electrodes included in the liquid lens, that is, the sum of the individual electrodes and the common electrode. That is, the number of switching elements included in the plurality of second switching units 250a, 250b, 250c, 250d, and 250e may be twice the sum of the numbers of the individual electrodes and the common electrode included in the liquid lens. For example, when four individual electrodes and one common electrode are included in the liquid lens, the number of electrodes may be 5, and the number of switching elements included in the plurality of second switching units may be 10.

If eight individual electrodes and one common electrode are included in the liquid lens, the number of electrodes may be 9, and the number of switching elements included in the plurality of second switching units may be 18. Meanwhile, in accordance with an embodiment, the number of switching elements included in the drive voltage control circuit may be fixed, even when the number of electrodes included in the liquid lens is varied.

FIG. 19 explains a first operation example of the control circuit illustrated in FIG. 18. For convenience of description, the following description will be given mainly in conjunction with drive voltages applied to the first individual electrode L1 and the common electrode C0. Meanwhile, the same drive voltage as that of the first individual electrode L1 or drive voltages different from that of the first individual electrode L1 may be applied to other individual electrodes L2, L3 and L4 at the same time t. In particular, FIG. 19 explains the case in which a positive voltage is applied to the common electrode C0.

As illustrated, referring to a timing diagram, a plurality of operation modes ①, ②, ③, ④ and ⑤ may be present in accordance with timings at which drive voltages are applied to the first individual electrode L1 and the common electrode C0, respectively. First, in a first mode ①, a ground voltage is applied to both the common electrode C0 and the first individual electrode L1. In a second mode ②, a positive voltage generated in the voltage generator 232 is applied to the common electrode C0 and the ground voltage is applied to the first individual electrode L1. In a third mode ③, the positive voltage generated in the voltage generator 232 is applied to the common electrode C0 and a negative voltage transmitted from the charge pump is applied to the first individual electrode L1. In a fourth mode ④, the ground voltage is applied to the common electrode C0 and the negative voltage is applied to the first individual electrode L1. In a fifth mode ⑤, the ground voltage is applied to both the common electrode C0 and the first individual electrode L1. In the first to fifth modes ①, ②, ③, ④, and ⑤, movement of the interface 130 included in the liquid lens 28 (cf. FIG. 7) may be determined by the magnitude of a drive voltage Vop applied between the common electrode C0 and the first individual electrode L1. In this case, movement of the interface 130 may be controlled by an absolute value of the magnitude of the drive voltage Vop, irrespective of the polarity of the drive voltage Vop.

In the first to fifth modes ①, ②, ③, ④, and ⑤, drive voltages applied to the first individual electrode L1 and the common electrode C0 may be determined by ON/OFF of a plurality of switching elements included in the control circuit. When the ground voltage, the positive voltage, or the negative voltage is applied to the first individual electrode L1 and the common electrode C0, through which path and which switching elements the ground voltage, the positive voltage or the negative voltage is transmitted may be indicated by dotted lines and arrows as in FIG. 19.

Meanwhile, paths indicated by dotted lines and arrows in a circuit diagram of FIG. 19 are illustrative as an example. In accordance with an embodiment, drive voltages may be transmitted to the first individual electrode L1 and the common electrode C0 through various combinations of different paths.

FIG. 20 explains a second operation example of the control circuit illustrated in FIG. 18. For convenience of description, the following description will be given mainly in conjunction with drive voltages applied to the first individual electrode L1 and the common electrode C0. Meanwhile, the same drive voltage as that of the first individual electrode L1 or drive voltages different from that of the first individual electrode L1 may be applied to other individual electrodes L2, L3, and L4 at the same time t. In particular, FIG. 20 explains the case in which a negative voltage is applied to the common electrode C0.

As illustrated, referring to a timing diagram, a plurality of operation modes ①, ②, ③, ④, and ⑤ may be present in accordance with timings at which drive voltages are applied to the first individual electrode L1 and the common electrode C0, respectively. First, in a first mode ①, a ground voltage is applied to both the common electrode C0 and the first individual electrode L1. In a second mode ②, a negative voltage obtained after converting a positive voltage generated in the voltage generator 232 by the charge pump is applied to the common electrode C0, and the ground voltage is applied to the first individual electrode L1. In a third mode ③, the negative voltage obtained through the conversion of the charge pump is applied to the common electrode C0, and the positive voltage generated in the voltage generator 232 is applied to the first individual electrode L1. In a fourth mode ④, the ground voltage is applied to the common electrode C0, and the positive voltage generated in the voltage generator 232 is applied to the first individual electrode L1. In a fifth mode ⑤, the ground voltage is applied to both the common electrode C0 and the first individual electrode L1. In the first to fifth modes ①, ②, ③, ④, and ⑤, movement of the interface 130 included in the liquid lens 28 (cf. FIG. 7) may be determined by the magnitude of a drive voltage Vop applied between the common electrode C0 and the first individual electrode L1. In this case, movement of the interface 130 may be controlled by an absolute value of the magnitude of the drive voltage Vop, irrespective of the polarity of the drive voltage Vop.

In the first to fifth modes ①, ②, ③, ④, and ⑤, drive voltages applied to the first individual electrode L1 and the common electrode C0 may be determined by ON/OFF of a plurality of switching elements included in the control circuit. When the ground voltage, the positive voltage or the negative voltage is applied to the first individual electrode L1 and the common electrode C0, through which path and which switching elements the ground voltage, the positive voltage or the negative voltage is transmitted may be indicated by dotted lines and arrows as in FIG. 20.

Meanwhile, paths indicated by dotted lines and arrows in a circuit diagram of FIG. 20 are illustrative as an example. In accordance with an embodiment, drive voltages may be transmitted to the first individual electrode L1 and the common electrode C0 through various combinations of different paths.

Referring to FIGS. 19 and 20, it may be possible to apply to the liquid lens a drive voltage corresponding to twice the magnitude of voltages applied to the first individual electrode L1 and the common electrode C0 by applying voltages having opposite polarities to the electrodes. When a drive voltage of about 70 V is needed to control movement of the interface included in the liquid lens, accordingly, it may be possible to obtain substantially the same effect as that of the case in which a drive voltage of about 70 V is applied, by applying voltages of about 35 V having different polarities to the first individual electrode L1 and the common electrode C0, respectively. Switching elements, which selectively transmit lower voltages, may be manufactured to have smaller sizes and, as such, the control circuit may achieve miniaturization, and may enhance integration degree.

FIG. 21 explains a sixth example of the control circuit.

As illustrated, the control circuit may include a drive voltage output unit 230B for outputting a plurality of voltages each having a predetermined magnitude and a polarity (positive polarity or negative polarity), a first switching unit 240 for selectively transmitting one of the voltages received from the drive voltage output unit 230B and a ground voltage (earth voltage), and a second switching unit 250 for selectively transmitting a drive voltage received from the first switching unit 240 to the electrode 260 of the liquid lens 28 (cf. FIG. 7).

The drive voltage output unit 230B may include a first voltage generator 232 for performing voltage boosting to a predetermined magnitude, based on a source voltage or a supply voltage, thereby outputting a first voltage, and a second voltage generator 236 for performing voltage boosting to a predetermined magnitude, based on the source voltage or the supply voltage, thereby outputting a second voltage having an opposite polarity to the first voltage. As compared to the control circuit explained in FIG. 16, the drive voltage output unit 230B may include the second voltage generator 236 capable of individually generating the second voltage, in place of use of the charge pump 234.

The first switching unit 240 may include a first switch 242, which may selectively transmit the first voltage received from the first voltage generator 232, and a second switch 244, which may selectively transmit a first ground voltage. In addition, the first switching unit 240 may further include a fourth switch 246, which may selectively transmit the second voltage received from the second voltage generator 236, and a fifth switch 248, which may selectively transmit a second ground voltage. In accordance with an embodiment, the first switching unit 240 may be designed as including a first sub-switching unit and a second sub-switching unit, as explained in FIG. 16.

The first switching unit 240 may include two different input stages and two different output stages. In addition, the first ground voltage and the second ground voltage may be electrically connected.

The second switching unit 250 may include a third switch 252, which, upon receiving one of the first voltage and the first ground voltage, may selectively supply the received voltage to the liquid lens electrode 260, and a sixth switch 254, which, upon receiving one of the second voltage and the second ground voltage, may selectively supply the received voltage to the liquid lens electrode 260.

The first switching unit 240 may be disposed in common at electrodes included in the liquid lens 28. For example, the first switching unit 240 is shared among a plurality of individual electrodes included in the liquid lens and, as such, a drive voltage may be transmitted to the plurality of individual electrodes via at least one first switching unit 240.

On the other hand, it is necessary for the second switching unit 250 to be individually disposed at each of the electrodes included in the liquid lens 28. For example, independent second switching units 250 may be connected to the plurality of individual electrodes included in the liquid lens 28, respectively. In this regard, the second switching unit 250 may not be shared among liquid lens electrodes 260.

FIG. 22 explains a seventh example of the control circuit.

As illustrated, the control circuit may include a first voltage generator 232 for generating a voltage having a predetermined polarity and a predetermined magnitude, a second voltage generator 236 for generating a voltage having an opposite polarity to the voltage output from the first voltage generator 232, independently of the first voltage generator 232, a plurality of switching elements 242a, 242b, 244a, 244b, 244c, 244d, 244e, 246a, 246b, 248a, and 248b for transmitting a drive voltage to a plurality of electrodes L1, L2, L3, L4 and C0 included in the liquid lens, and a plurality of second switching units 250a, 250b, 250c, 250d, and 250e for selectively transmitting the voltages received from the plurality of switching elements to the plurality of electrodes L1, L2, L3, L4 and C0 included in the liquid lens. Here, the plurality of switching elements 242a, 242b, 244a, 244b, 244c, 244d, 244e, 246a, 246b, 248a, and 248b may correspond to the first switching unit 240 explained in FIG. 12. For example, the first voltage generator may include a voltage booster, and the second voltage generator may be embodied in a similar form to the first voltage generator.

In accordance with the control circuit explained in FIG. 21, six switch elements may be connected to each liquid lens electrode 260. In the control circuit explained in FIG. 22, however, a part of the switch elements disposed at the individual electrodes L1, L2, L3 and L4 among the plurality of electrodes L1, L2, L3, L4 and C0 included in the liquid lens, is connected in common and, as such, the number of switch elements may be reduced. For example, when the liquid lens includes four individual electrodes and one common electrode, the control circuit explained in FIG. 13 may include a total of 30 (5×6) switching elements, whereas the control circuit explained in FIG. 14 may include a total of 21 switching elements.

FIG. 23 explains an eighth example of the control circuit.

As illustrated, the control circuit may include a first voltage generator 232 for generating a voltage having a predetermined polarity and a predetermined magnitude, a second voltage generator 236 for generating a voltage having an opposite polarity to the voltage output from the first voltage generator 232, independently of the first voltage generator 232, a plurality of switching elements 242a, 242b, 244a, 244b, 246a, 246b, 248a, and 248b for transmitting a drive voltage to a plurality of electrodes L1, L2, L3, L4 and C0 included in the liquid lens, and a plurality of second switching units 250a, 250b, 250c, 250d, and 250e for selectively transmitting the voltages received from the plurality of switching elements to the plurality of electrodes L1, L2, L3, L4 and C0 included in the liquid lens. Here, the plurality of switching elements 242a, 242b, 244a, 244b, 246a, 246b, 248a, and 248b may correspond to the first switching unit 240 explained in FIG. 16.

When the liquid lens includes four individual electrodes and one common electrode, the control circuit explained in FIG. 23 may include 18 switching elements while the control circuit explained in FIG. 22 may include 21 switching elements. It may be possible to further reduce the number of switching elements included in the control circuit, as in FIG. 23, through a method of connecting, in common, the switching elements for selectively transmitting a ground voltage to respective individual elements included in the liquid lens, without individually disposing the switching elements to respective individual elements. As the number of switching elements is reduced, it may be possible to reduce the size of the entirety of the control circuit while reducing power consumption of the control circuit.

Referring to FIG. 23, the number of the plurality of switching elements 242a, 242b, 244a, 244b, 246a, 246b, 248a, and 248b corresponding to the first switching unit 240 explained in FIG. 21 may be fixed, irrespective of the number of electrodes included in the liquid lens. For example, it may be possible to embody the first switching unit 240 explained in FIG. 21 using only eight switching elements, irrespective of the case in which the number of individual electrodes included in the liquid lens is 4, 8, 12, or 16. On the other hand, the number of switching elements included in the plurality of second switching units 250a, 250b, 250c, 250d, and 250e may correspond to the number of electrodes included in the liquid lens, that is, the sum of the individual electrodes and the common electrode. That is, the number of switching elements included in the plurality of second switching units 250a, 250b, 250c, 250d, and 250e may be twice the sum of the numbers of the individual electrodes and the common electrode included in the liquid lens. For example, when four individual electrodes and one common electrode are included in the liquid lens, the number of electrodes may be 5, and the number of switching elements included in the plurality of second switching units may be 10.

If eight individual electrodes and one common electrode are included in the liquid lens, the number of electrodes may be 9, and the number of switching elements included in the plurality of second switching units may be 18. Meanwhile, in accordance with an embodiment, the number of switching elements included in the drive voltage control circuit may be fixed, even when the number of electrodes included in the liquid lens is varied.

FIG. 24 explains a first operation example of the control circuit illustrated in FIG. 23. For convenience of description, the following description will be given mainly in conjunction with drive voltages applied to the first individual electrode L1 and the common electrode C0. Meanwhile, the same drive voltage as that of the first individual electrode L1 or drive voltages different from that of the first individual electrode L1 may be applied to other individual electrodes L2, L3 and L4 at the same time t. In particular, FIG. 24 explains the case in which a positive voltage is applied to the common electrode C0.

As illustrated, referring to a timing diagram, a plurality of operation modes ①, ②, ③, ④, and ⑤ may be present in accordance with timings at which drive voltages are applied to the first individual electrode L1 and the common electrode C0, respectively. First, in a first mode ①, a ground voltage is applied to both the common electrode C0 and the first individual electrode L1. In a second mode ②, a positive voltage generated in the first voltage generator 232 is applied to the common electrode C0 and the ground voltage is applied to the first individual electrode L1. In a third mode ③, the positive voltage generated in the first voltage generator 232 is applied to the common electrode C0 and a negative voltage transmitted from the second voltage generator 236 is applied to the first individual electrode L1. In a fourth mode ④, the ground voltage is applied to the common electrode C0, and the negative voltage transmitted from the second voltage generator 236 is applied to the first individual electrode L1. In a fifth mode ⑤, the ground voltage is applied to both the common electrode C0 and the first individual electrode L1. In the first to fifth modes ①, ②, ③, ④, and ⑤, movement of the interface 130 included in the liquid lens 28 (cf. FIG. 7) may be determined by the magnitude of a drive voltage Vop applied between the common electrode C0 and the first individual electrode L1. In this case, movement of the interface 130 may be controlled by an absolute value of the magnitude of the drive voltage Vop, irrespective of the polarity of the drive voltage Vop.

In the first to fifth modes ①, ②, ③, ④, and ⑤, drive voltages applied to the first individual electrode L1 and the common electrode C0 may be determined by ON/OFF of a plurality of switching elements included in the control circuit. When the ground voltage, the positive voltage or the negative voltage is applied to the first individual electrode L1 and the common electrode C0, through which path and which switching elements the ground voltage, the positive voltage or the negative voltage is transmitted may be indicated by dotted lines and arrows as in FIG. 16.

Meanwhile, paths indicated by dotted lines and arrows in a circuit diagram of FIG. 24 are illustrative as an example. In accordance with an embodiment, drive voltages may be transmitted to the first individual electrode L1 and the common electrode C0 through various combinations of different paths.

FIG. 25 explains a second operation example of the control circuit illustrated in FIG. 23. For convenience of description, the following description will be given mainly in conjunction with drive voltages applied to the first individual electrode L1 and the common electrode C0. Meanwhile, the same drive voltage as that of the first individual electrode L1 or drive voltages different from that of the first individual electrode L1 may be applied to other individual electrodes L2, L3 and L4 at the same time t. In particular, FIG. 25 explains the case in which a negative voltage is applied to the common electrode C0.

As illustrated, referring to a timing diagram, a plurality of operation modes ①, ②, ③, ④, and ⑤ may be present in accordance with timings at which drive voltages are applied to the first individual electrode L1 and the common electrode C0, respectively. First, in a first mode ①, a ground voltage is applied to both the common electrode C0 and the first individual electrode L1. In a second mode ②, a negative voltage generated in the second voltage generator 236 is applied to the common electrode C0, and the ground voltage is applied to the first individual electrode L1. In a third mode ③, the negative voltage generated in the second voltage generator 236 is applied to the common electrode C0, and a positive voltage generated in the first voltage generator 232 is applied to the first individual electrode L1. In a fourth mode ④, the ground voltage is applied to the common electrode C0, and the positive voltage generated in the voltage generator 232 is applied to the first individual electrode L1. In a fifth mode ⑤, the ground voltage is applied to both the common electrode C0 and the first individual electrode L1. In the first to fifth modes ①, ②, ③, ④, and ⑤, movement of the interface 130 included in the liquid lens 28 (cf. FIG. 7) may be determined by the magnitude of a drive voltage Vop applied between the common electrode C0 and the first individual electrode L1. In this case, movement of the interface 130 may be controlled by an absolute value of the magnitude of the drive voltage Vop, irrespective of the polarity of the drive voltage Vop.

In the first to fifth modes ①, ②, ③, ④, and ⑤, drive voltages applied to the first individual electrode L1 and the common electrode C0 may be determined by ON/OFF of a plurality of switching elements included in the control circuit. When the ground voltage, the positive voltage or the negative voltage is applied to the first individual electrode L1 and the common electrode C0, through which path and which switching elements the ground voltage, the positive voltage or the negative voltage is transmitted may be indicated by dotted lines and arrows as in FIG. 25.

Meanwhile, paths indicated by dotted lines and arrows in a circuit diagram of FIG. 25 are illustrative as an example. In accordance with an embodiment, drive voltages may be transmitted to the first individual electrode L1 and the common electrode C0 through various combinations of different paths.

Referring to FIGS. 24 and 25, it may be possible to apply to the liquid lens a drive voltage corresponding to twice the magnitude of voltages applied to the first individual electrode L1 and the common electrode C0 by applying voltages having opposite polarities to the electrodes. When a drive voltage of about 70 V is needed to control movement of the interface included in the liquid lens, accordingly, it may be possible to obtain substantially the same effect as that of the case in which a drive voltage of about 70 V is applied, by applying voltages of about 35 V having different polarities to the first individual electrode L1 and the common electrode C0, respectively. Switching elements, which selectively transmit lower voltages, may be manufactured to have smaller sizes and, as such, the control circuit may achieve miniaturization, and may enhance integration degree.

The above-described liquid lens may be included in a camera module. The camera module may include a lens assembly including a liquid lens mounted in a housing and at least one solid lens, which may be disposed at a front or rear surface of the liquid lens, an image sensor for converting an optical signal transmitted through the lens assembly into an electrical signal, and a control circuit for supplying a drive voltage to the liquid lens.

Although several embodiments have been described, other embodiments may be implemented in various forms. The technical contents of the above-described embodiments may be combined in various forms, so long as there is no compatibility thereamong, and new embodiments may be implemented through such combination.

An optical device or an optical instrument, which includes the above-described camera module, may be embodied. Here, the optical device may include a device capable of processing or analyzing an optical signal. Examples of the optical device may be a camera/video device, a telescope device, a microscope device, an interferometer device, a photometer device, a polarimeter device, a spectrometer device, a reflectometer device, an autocollimator device, a lensmeter device, and the like. An embodiment of the present invention may be applied to an optical device, which may include a liquid lens. In addition, the optical device may be embodied as a portable device such as a smartphone, a notebook computer, a tablet computer or the like. Such an optical device may include a camera module, a display unit for outputting an image, and a body housing, in which the camera module and the display unit are mounted. A communication module capable of communicating with another device may be mounted in the body housing of the optical device. The optical device may further include a memory unit capable of storing data.

The method according to the above-described embodiment may be composed as a program to be executed in a computer and, as such, may be stored in a recording medium that can be read by a computer. Examples of the recording medium that can be read by a computer include a read only memory (ROM), a random access memory (RAM), a CD-ROM, a magnetic tape, a floppy disk, an optical data storage, and the like.

The computer-readable recording medium is distributed to computer systems connected over a network, and computer-readable code may be stored and executed in a distributed manner. Further, a functional program, code and code segments for implementing the above-described method may be easily inferred by programmers in the technical field to which the embodiment pertains.

Those skilled in the art to which the present invention pertains can appreciate that the invention may be embodied in other specific forms without changing the technical spirit or essential characteristics. Therefore, the above detailed description should be understood as exemplary rather than limiting in all aspects. The scope of the present invention should also be interpreted by the claims below. All modifications as would be derived from the equivalent concept intended to be included within the scope of the present invention should also be interpreted as falling within the scope of the invention.

The invention claimed is:

1. A liquid lens drive voltage control circuit, comprising:
a first voltage generator outputting a first voltage;
a second voltage generator outputting a second voltage having an opposite polarity to the first voltage;
a first switch selecting one of the first voltage and a ground voltage, and transmitting the selected voltage;
a second switch selecting one of the second voltage and the ground voltage, and transmitting the selected voltage; and
a third switch selecting one of the voltage selected by the first switch and the voltage selected by the second switch, and transmitting the selected voltage.

2. The liquid lens drive voltage control circuit according to claim 1, wherein the third switch is plural in number, and the first switch is connected in common to the plural third switches, and
wherein the first switch comprises:
a third switch element disposed between a first contact point connected in common to the plurality of the third switches and the first voltage; and
a fourth switch element connected between the first contact point and the ground voltage.

3. The liquid lens drive voltage control circuit according to claim 2, wherein the second switch comprises:
a fifth switch element connected between a second contact point connected in common to the plurality of the third switches and the second voltage; and
a sixth switch element connected between the second contact point and the ground voltage.

4. The liquid lens drive voltage control circuit according to claim 1, wherein the third switch is plural in number,
wherein the liquid lens drive voltage control circuit is operatively connected to a liquid lens comprising a common electrode and a plurality of individual electrodes and adjustable in focal distance in accordance with application of the first voltage, the second voltage or the ground voltage to the common electrode or the individual electrodes, and
wherein the plural third switches are connected to the plurality of individual electrodes, respectively.

5. The liquid lens drive voltage control circuit according to claim 4, wherein the liquid lens comprises:
a first plate including a cavity, in which a conductive liquid and a non-conductive liquid are disposed;
a first electrode disposed over the first plate;
a second electrode disposed beneath the first plate, the second electrode comprising a plurality of electrode sectors;
a second plate disposed over the first electrode; and
a third plate disposed beneath the second electrode.

6. The liquid lens drive voltage control circuit according to claim 4, wherein the second voltage generator includes a charge pump receiving the first voltage from the first voltage generator, converting a polarity of the received voltage, and outputting the polarity-converted voltage.

7. The liquid lens drive voltage control circuit according to claim 4, wherein the first voltage has a positive polarity, and
wherein the second voltage generator outputs the second voltage, which has the same magnitude as the first voltage while having a negative polarity, independently of the first voltage generator.

8. The liquid lens drive voltage control circuit according to claim 4, wherein the liquid lens includes four or eight individual electrodes and one common electrode.

9. The liquid lens drive voltage control circuit according to claim 4, wherein the number of the plurality of individual electrodes is four, and the number of the plural third switches is four.

10. The liquid lens drive voltage control circuit according to claim 4, wherein the first switch is capable of being disposed in common at the plurality of individual electrodes, and switch elements included in the third switches are disposed at the plurality of individual electrodes in an independent manner, respectively.

11. The liquid lens drive voltage control circuit according to claim 10, wherein the second switch is connected in common at the plurality of individual electrodes.

12. The liquid lens drive voltage control circuit according to claim 4, further comprising:
a fourth switch selecting one of the first voltage and the ground voltage;
a fifth switch selecting one of the second voltage and the ground voltage; and
a sixth switch selecting one of the fourth switch and the fifth switch,
wherein the sixth switch is connected to the common electrode, and the fourth switch and the fifth switch are connected to the sixth switch.

13. The liquid lens drive voltage control circuit according to claim 12, wherein the liquid lens drive voltage circuit controls switching operations of the first to sixth switches to apply voltages having opposite polarities to one of the individual electrodes and the common electrode.

14. The liquid lens drive voltage control circuit according to claim 12, wherein the fourth switch comprises:
a seventh switch element connected between the first voltage and the sixth switch; and
an eighth switch element connected between a third contact point and the ground voltage, the third contact point being between the sixth switch element and the seventh switch element.

15. The liquid lens drive voltage control circuit according to claim 14, wherein the fifth switch comprises:
a ninth switch element connected between the sixth switch and the second voltage; and
a tenth switch element connected between a fourth contact point and the ground voltage, the fourth contact point being between the sixth switch element and the ninth switch element.

16. The liquid lens drive voltage control circuit according to claim 12, wherein the number of switch elements included in the third switch and the sixth switch is twice the number of the individual electrodes and the common electrode.

17. The liquid lens drive voltage control circuit according to claim 12, wherein the third switch comprises:
a plurality of first switch elements connected to the individual electrodes in an individual manner, respectively, to selectively transmit the first voltage; and
a plurality of second switch elements connected to the individual electrodes in an individual manner, respectively, to selectively transmit the second voltage.

18. The liquid lens drive voltage control circuit according to claim 12, wherein the liquid lens comprises four individual electrodes and one common electrode, and the sum of switch elements included in the first to sixth switches is eighteen.

19. A camera module, comprising:
a lens assembly, the lens assembly comprising:
a liquid lens; and
a solid lens disposed on at least one of a front or rear surface of the liquid lens;

an image sensor converting an optical signal transmitted through the lens assembly into an electrical signal; and a control circuit supplying a drive voltage to the liquid lens, the control circuit including the liquid lens driving voltage control circuit of claim 1.

20. An optical device, comprising the camera module of claim 19.

* * * * *